(12) United States Patent
Carré et al.

(10) Patent No.: US 12,057,679 B2
(45) Date of Patent: Aug. 6, 2024

(54) CLADDING GLASS FOR SOLID-STATE LASERS

(71) Applicant: SCHOTT AG, Mainz (DE)

(72) Inventors: Antoine Carré, Mainz (DE); Alain Danielou, Guyancourt (FR); Stefanie Hansen, Gensingen (DE); Dirk Apitz, Lausanne (CH)

(73) Assignee: SCHOTT AG, Mainz (DE)

( * ) Notice: Subject to any disclaimer, the term of this patent is extended or adjusted under 35 U.S.C. 154(b) by 194 days.

(21) Appl. No.: 16/844,035

(22) Filed: Apr. 9, 2020

(65) Prior Publication Data
US 2021/0028605 A1    Jan. 28, 2021

(30) Foreign Application Priority Data

Jul. 22, 2019    (CN) .......................... 201910662499.5

(51) Int. Cl.
*H01S 3/06*    (2006.01)
*C03C 3/068*    (2006.01)
(Continued)

(52) U.S. Cl.
CPC ............ *H01S 5/3215* (2013.01); *C03C 3/068* (2013.01); *C03C 4/0071* (2013.01); *C03C 4/082* (2013.01);
(Continued)

(58) Field of Classification Search
CPC ...... H01S 3/1625; H01S 3/1636; H01S 3/176; C03C 4/0071; C03C 4/082
See application file for complete search history.

(56) References Cited

U.S. PATENT DOCUMENTS 3,885,974 A * 5/1975 Asahara ................. C03C 3/21
                                                        501/24
3,988,697 A * 10/1976 Cooley ................. H01S 3/0604
                                                        501/75

(Continued)

FOREIGN PATENT DOCUMENTS

| CN | 1985201 | 6/2007 |
|---|---|---|
| CN | 101337768 | 1/2009 |

(Continued)

OTHER PUBLICATIONS

Wikipedia, "Czochralski process", Nov. 16, 2017, https://en.wikipedia.org/w/inclex.php?title=Czochralski_process&oldid=810674766, 6 pages.

(Continued)

*Primary Examiner* — Tod T Van Roy
(74) *Attorney, Agent, or Firm* — Ruggiero McAllister & McMahon LLC

(57) ABSTRACT

The present disclosure relates to a glass having a refractive index of at least 1.7 as well as the use of the glass as a cladding glass of a solid-state laser. The disclosure also relates to a laser component comprising a core of doped sapphire and a cladding glass being placed on said core. The cladding glass is arranged on said core such that light exiting from the core due to parasitic laser activity can enter the cladding glass and can be absorbed there. Thus, a laser component with improved efficiency is obtained. The present disclosure also relates to a method for producing the laser component.

17 Claims, 3 Drawing Sheets

(51) Int. Cl.
  *C03C 4/00* (2006.01)
  *C03C 4/08* (2006.01)
  *C03C 14/00* (2006.01)
  *H01S 3/16* (2006.01)
  *H01S 3/17* (2006.01)
  *H01S 5/20* (2006.01)
  *H01S 5/32* (2006.01)
  *C03C 3/07* (2006.01)
  *C03C 17/22* (2006.01)
  *C03C 17/28* (2006.01)
  *C03C 21/00* (2006.01)

(52) U.S. Cl.
  CPC ............ *C03C 14/00* (2013.01); *H01S 3/0612* (2013.01); *H01S 3/1636* (2013.01); *H01S 3/176* (2013.01); *H01S 5/2022* (2013.01); *H01S 5/3224* (2013.01); *C03C 3/07* (2013.01); *C03C 17/22* (2013.01); *C03C 17/28* (2013.01); *C03C 21/00* (2013.01); *H01S 3/0625* (2013.01); *H01S 3/1625* (2013.01)

(56) References Cited

U.S. PATENT DOCUMENTS

| | | | | |
|---|---|---|---|---|
| 4,060,422 A * | 11/1977 | Asahara | ............... | C03C 4/082 501/48 |
| 4,217,382 A * | 8/1980 | Toratani | ............... | H01S 3/0612 372/40 |
| 4,229,220 A * | 10/1980 | Hirota | ............... | C03C 3/17 501/46 |
| 4,526,874 A * | 7/1985 | Grabowski geb. Marszalek ........ C03C 3/064 501/901 |
| 4,849,036 A * | 7/1989 | Powell | ............... | C03C 4/0071 156/99 |
| 5,508,235 A * | 4/1996 | Marker | ............... | C03C 13/046 501/63 |
| 5,718,979 A * | 2/1998 | Marker | ............... | C03C 13/046 428/428 |
| 6,160,824 A | 12/2000 | Meissner et al. | | |
| 6,904,069 B2 * | 6/2005 | Honea | ............... | H01S 3/09415 372/39 |
| 7,463,660 B2 * | 12/2008 | Hackel | ............... | H01S 3/0602 372/39 |
| 7,477,674 B2 * | 1/2009 | Vetrovec | ............... | H01S 3/0941 372/103 |
| 7,515,332 B2 * | 4/2009 | Tsuda | ............... | C03C 4/12 359/341.5 |
| 8,268,649 B2 * | 9/2012 | Vetrovec | ............... | H01S 3/081 438/455 |
| 8,682,125 B2 * | 3/2014 | Bayramian | ............... | H01S 3/0612 385/123 |
| 9,145,328 B2 | 9/2015 | Wei | | |
| 9,469,915 B2 * | 10/2016 | Kolis | ............... | H01S 3/0612 |
| 9,899,798 B2 * | 2/2018 | Chang | ............... | H01S 3/025 |
| 10,389,079 B2 * | 8/2019 | Carré | ............... | H01S 3/0612 |
| 10,686,289 B2 * | 6/2020 | Gaume | ............... | H01S 3/0625 |
| 2006/0019815 A1 * | 1/2006 | Inoue | ............... | C03C 3/078 501/72 |
| 2007/0087928 A1 | 4/2007 | Rosenflanz et al. | | |
| 2009/0111677 A1 | 4/2009 | Clare et al. | | |
| 2010/0222199 A1 | 9/2010 | Wolff et al. | | |
| 2012/0051082 A1 | 3/2012 | Hsu et al. | | |
| 2014/0146839 A1 * | 5/2014 | George | ............... | H01S 3/16 372/40 |
| 2014/0146840 A1 * | 5/2014 | George | ............... | H01S 3/175 252/301.6 F |
| 2015/0362684 A1 * | 12/2015 | Seo | ............... | G02B 6/4296 65/395 |
| 2016/0090320 A1 | 3/2016 | Negishi | | |
| 2017/0233287 A1 * | 8/2017 | Li | ............... | C03C 3/068 428/172 |
| 2018/0090904 A1 * | 3/2018 | Carré | ............... | H01S 3/0602 |
| 2021/0028605 A1 * | 1/2021 | Carré | ............... | H01S 3/1636 |
| 2021/0130222 A1 * | 5/2021 | Li | ............... | G02B 5/208 |
| 2021/0238085 A1 * | 8/2021 | Li | ............... | C03C 3/089 |

FOREIGN PATENT DOCUMENTS

| | | | |
|---|---|---|---|
| CN | 102311229 | | 1/2012 |
| CN | 104092087 | | 10/2014 |
| CN | 102320739 | | 4/2015 |
| CN | 104926106 | | 9/2015 |
| EP | 0716050 B1 | * | 9/1998 |
| EP | 2261181 | | 12/2010 |
| GB | 1003452 | | 9/1965 |
| GB | 2432253 | | 5/2007 |
| JP | 2001213640 | | 8/2001 |
| JP | 2004-170741 | | 6/2004 |
| JP | 2009269771 | | 11/2009 |
| JP | 2012248609 A | * | 12/2012 |
| JP | 2013038096 A | * | 2/2013 |
| RU | 2269848 | | 2/2006 |
| WO | 2013/084706 | | 6/2013 |

OTHER PUBLICATIONS

Wikipedia, "Bridgman-Stockbarger technique", Jan. 29, 2018, https://en.wikipedia.org/w/index.php?title=Bridgman-Stockbargertechnique &oldid=822974072, 2 pages.

Patterson et al., "Suppression of parasitic lasing in large-aperture Ti: sapphire laser amplifiers", Optics Letters, vol. 24, Issue 14, 1999, Optical Society of America, pp. 963-965.

Meissner et al, "Edge-cladding glasses for solid-state laser garnet crystals", Journal of Applied Physics, vol. 62, Issue 7, Aug. 1998, 4 pages, Abstract.

* cited by examiner

CLADDING GLASS FOR SOLID-STATE LASERS

CROSS-REFERENCE TO RELATED APPLICATIONS

The present application claims the benefit of Chinese Patent Application No. 201910662499.5, filed on Jul. 22, 2019, which is herein incorporated by reference.

BACKGROUND OF THE DISCLOSURE

1. Field of the Disclosure

The present disclosure related to doped sapphire with cladding glasses. More particularly, the present disclosure is related to cladding glass suitable for suppressing parasitic light in the visible range.

2. Description of the Related Art

Optically excited lasers, the amplifying medium of which comprises a crystalline or glasslike solid (which is also called host crystal or host material), are generally referred to as solid-state lasers. The host crystal is doped with ions of an extraneous material. By the introduction of energy into the laser medium electrons are energized to a higher energy level so that excited atoms result. This process is also referred to as pumping. Normally, solid-state lasers are optically pumped. When an atom which has been excited such is stimulated by a photon having the energy to be emitted, then the excited atom again falls back into its normal state and thereby emits a photon with identical energy as well as an identical phase position to the stimulating photon.

The directions of motion of both photons are the same. Due to this duplication of the stimulating photon the laser medium acts as a light amplifier which is also referred to as classical "lasing". Mostly, laser activity is initiated by spontaneous emission through which electrons statistically, after a material-specific half-life, fall back into their normal state and thereby emit a photon having an individual direction and phase position each. A laser operation is typically reached, when in addition to the active medium a cavity of at least partially reflecting mirrors exists, between which photons having a certain direction are again guided through the active medium and then stimulate further emissions. Then, photons having this direction and having the same phase will prevail. Normally, photons which are emitted in another direction by spontaneous emission will not be amplified.

One type of host crystal is sapphire. Sapphire is a crystalline form of $Al_2O_3$ which is characterized by a particularly high hardness. A sapphire crystal is an optically negative uniaxial crystal which can be described by the crystallographic axis c and the crystallographic axes a and b being perpendicular with respect to c and with respect to each other. In the case of sapphire the crystallographic axis c is the optical axis. Also in the case of sapphire the highest amplification of light can be achieved for radiation which propagates orthogonally with respect to the optical axis. But since both the axis a and also the axis b are orthogonal to the axis c, there are thus two axes (a, b) which are again respectively orthogonal to each other, along which amplification of light may arise. However, normally, only an amplification in one of both directions is desired so that only in one of these directions an exit of the amplified light is envisaged. The amplifications of spontaneous emissions arising perpendicularly with respect to this preferred direction are also referred to as parasitic laser activities. By the parasitic laser activities further excited atoms are stimulated to emission without the possibility of using the emitted photons for the desired laser operation, because they do not propagate along the preferred orientation, but in a perpendicular orientation thereto. Thus, the parasitic laser activities are connected with a reduction of the efficiency of the laser, because energy being pumped into the laser medium remains unused, thus is lost in this way. So the efficiency of the laser will be reduced.

Spontaneous emission in directions which are different from the laser direction cannot be suppressed within the laser medium. However, this phenomenon is particularly problematic, when at the boundary surface between the sapphire crystal and the surrounding medium (normally air) a proportion of the light is reflected back into the crystal or is reflected back and forth even several times and thus provides a further amplification of the parasitic laser activity and dissipates further energy by means of stimulated emission. This case is referred to as parasitic oscillations. When the amplification (also gain) of laser light in the active medium in a parasitic direction is high, then only low reflectivity is enough, such as e.g. in the case of a not non-reflecting boundary surface between the laser medium and air, for causing a considerable loss of energy. Thus, the parasitic laser activity can be attenuated by preventing the back reflection of the light being perpendicular to the direction of the radiation of the laser into the sapphire crystal or by at least attenuating it considerably.

In the case of doped sapphire the amplification of the light originating from parasitic laser activity (parasitic laser light) is so high, in particularly orthogonal to the preferred amplification orientation and orthogonal to the crystallographic axis c of the sapphire, that even also in the case of an antireflection coating on the lateral surface of the laser crystal strong reflections occur so that this problem is solved by the use of measures which suppress the reflections of parasitic laser light still further.

Such a solution is the following: bringing diiodine methane (as a liquid cladding material) in contact with the lateral surface of the laser medium. This liquid has an adjusted refractive index and absorbs the parasitic light so that reflections are suppressed. But this liquid has several decisive disadvantages. Firstly, the fact that it is a liquid and not a solid results in a more complicated and failure-prone laser system. Secondly, the area via which the laser medium is in contact with the liquid is limited, since the laser medium has to be held and fixed also beyond the laser areas. Thirdly, this liquid is hazardous to health. Fourthly, this liquid decomposes over time and has to be replaced at regular intervals. Fifthly, for such a solution of the problem the refractive index has to be adjusted over a certain wavelength range and, while the reflective index at the central wavelength can minimally be changed by means of addition of additives, the dispersion (the dependency of the refractive index on the wavelength) is constant more or less and is different from that of the sapphire.

Therefore, there were some attempts to reduce the parasitic oscillations with a solid cladding and thus to increase the efficiency of the laser. One principle of function which is based on the suppression of parasitic light by the use of a cladding glass is described in U.S. Pat. No. 4,217,382 A, but this invention relates to the special case of neodymium-doped fluorophosphate glass. In this system the wavelength of the parasitic laser light to be suppressed is 1052 nm and the refractive index of the active medium is ca. 1.46, i.e. the invention which is described in U.S. Pat. No. 4,217,382 A is not at all suitable as a cladding for doped sapphire.

BRIEF SUMMARY OF THE DISCLOSURE

Therefore, it is an object of the present disclosure to provide a means which in the case of doped sapphire is suitable for suppressing parasitic light in the visible range and overcomes the disadvantages of the glass known from prior art.

The present disclosure provides a glass, in particular a cladding glass for doped sapphire which is excellently suitable for this purpose. Advantageously, the cladding glass is arranged on the surface of the doped sapphire crystal such that the light of parasitic laser activity impinges onto the boundary surface crystal/cladding glass instead of the boundary surface crystal/air. Due to the fact that the refractive index of the cladding glass is adjusted to the refractive index of the sapphire crystal such that their differences are very small, the appearing reflection is strongly reduced and a passage of a large part of the light from the crystal into the cladding glass becomes possible. In this case, however, it has to be considered that a sapphire crystal, due to the strong anisotropy of the material, is characterized by two main indices of refraction, namely an ordinary refractive index $n_o$ and an extraordinary refractive index $n_e$. The extraordinary refractive index pertains to light which is polarized in parallel direction to the optical axis (n-polarized light). Since the troublesome proportion of the parasitic laser light for the most part is n-polarized light, it is advantageous, when the cladding glass has a refractive index which is adjusted to the extraordinary refractive index of the doped sapphire. In the present description the terms "refractive index", "index of refraction" and "refraction index" are used in a synonymous manner.

There is the risk that the parasitic laser light having entered the cladding glass is reflected at the boundary surface cladding glass/air not facing the core and, after crossing the cladding glass again, again enters the doped sapphire. For preventing this it is advantageous, when the cladding glass in the wavelength range of the parasitic laser light has an internal transmission which is as low as possible. Because, when the parasitic laser light is efficiently absorbed in the cladding glass, it is not possible that it enters the doped sapphire again.

The present disclosure relates to a glass having a refractive index of at least 1.70 and comprising the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof and wherein glass absorbs at least 90.0%, preferably at least 99.0%, more preferably at least 99.9% of light having a wavelength of 800 nm, and wherein a thickness of the glass is at most 100 mm, preferably at most 20 mm.

The present disclosure also relates to a glass having a refractive index of at least 1.70 and comprising the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof and wherein the equation $$c \times \varepsilon_\lambda \times l > -\frac{1}{2} \ln\left(\frac{1-\mathcal{A}}{R_{Glass/Env}}\right)$$

is fulfilled, wherein c is the proportion of the absorption component in the glass in mol %, $\varepsilon_\lambda$ is the molar extinction coefficient of the absorption component for light of the wavelength $\lambda$ in (mm*mol %)$^{-1}$, l is the glass thickness in mm, $R_{Glass/Env}$ is the Fresnel coefficient given by the relation $$R_{Glass/Env} = \frac{(n_\lambda^{Env} - n_\lambda^{Glass})^2}{(n_\lambda^{Env} + n_\lambda^{Glass})^2} \text{ with } n_\lambda^{Glass}$$

being the refractive index of the glass for light of the wavelength $\lambda$ and $n_\lambda^{Env}$ being the refractive index of the environment for light of the wavelength $\lambda$, and A is the fraction of light of the wavelength $\lambda$ absorbed by the glass, wherein A is at least 0.95.

Preferably, the environment is selected from the group consisting of air, water, and diiodomethane.

Preferably, A is at least 0.99, more preferably at least 0.999.

The present disclosure also relates to a cladding glass of a solid-state laser, comprising the glass of the present disclosure or consisting of the glass of the present disclosure. Preferably, the glass of the present disclosure is a cladding glass of a solid-state laser.

The present disclosure also relates to a cladding glass having a refractive index of at least 1.70 and comprising the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof and wherein the glass has an optical depth t of at least 1 in the direction of the parasitic laser light.

In another embodiment, the glasses of the disclosure comprise the following components (in % by weight):

| Component | Proportion (% by weight) |
|---|---|
| $SiO_2$ | 10 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0.1 to 25 |
| $TiO_2$ | 1 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof.

In another embodiment, the glasses of the disclosure comprise the following components (in % by weight):

| Component | Proportion (% by weight) |
|---|---|
| $SiO_2$ | 20 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0.2 to 25 |
| $TiO_2$ | 2 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CuO, CoO, $Fe_2O_3$, $V_2O_5$, CrO, MnO, $SeO_2$ and mixtures of two or more thereof.

The present disclosure also relates to a laser component, comprising
a) a core of doped sapphire, and
b) a cladding glass of the present disclosure being placed on said core.

In another embodiment, the present disclosure provides a glass having a refractive index of at least 1.70 comprising the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof and wherein the glass absorbs at least 90.0%, preferably at least 99.0%, more preferably at least 99.9% of light having a wavelength of 800 nm.

Preferably, in the case of a thickness of 1 mm the glass has in a wavelength range of 750 nm to 850 nm an internal transmission of at most 0.8, preferably at most 0.5, further preferably at most 0.4, further preferably at most 0.3, further preferably at most 0.2, further preferably at most 0.15, further preferably at most 0.1.

Preferably, for radiation in the wavelength range of 750 nm to 850 nm the extraordinary refractive index of the doped sapphire and the refractive index of the cladding glass differ from each other by at most 0.05, preferably at most 0.04, further preferably at most 0.03, further preferably at most 0.02, further preferably at most 0.01, further preferably at most 0.005, further preferably at most 0.002, further preferably at most 0.001, further preferably at most 0.0005.

In preferable embodiments, the cladding glass with a thickness of 1 mm even in a wavelength range of 700 nm to 900 nm has an internal transmission of at most 0.8, further preferably at most 0.5, further preferably at most 0.4, further preferably at most 0.3, further preferably at most 0.2, further preferably at most 0.15, further preferably at most 0.1, and for radiation in the wavelength range of 700 nm to 900 nm the extraordinary refractive index of the doped sapphire and the refractive index of the cladding glass differ from each other by at most 0.05, preferably at most 0.04, further preferably at most 0.03, further preferably at most 0.02, further preferably at most 0.01, further preferably at most 0.005, further preferably at most 0.002, further preferably at most 0.0015.

In still further preferable embodiments, the cladding glass with a thickness of 1 mm even in a wavelength range of 650 nm to 950 nm has an internal transmission of at most 0.8, further preferably at most 0.5, further preferably at most 0.4, further preferably at most 0.3, further preferably at most 0.2, further preferably at most 0.15, further preferably at most 0.1, and for radiation in the wavelength range of 650 nm to 950 nm the extraordinary refractive index of the doped sapphire and the refractive index of the cladding glass differ from each other by at most 0.05, preferably at most 0.04, further preferably at most 0.03, further preferably at most 0.02, further preferably at most 0.01, further preferably at most 0.005, further preferably at most 0.0025.

In still further preferable embodiments the cladding glass with a thickness of 1 mm even in a wavelength range of 600 nm to 1000 nm has an internal transmission of at most 0.8, further preferably at most 0.5, further preferably at most 0.4, further preferably at most 0.3, further preferably at most 0.2, further preferably at most 0.15, further preferably at most 0.1, and for radiation in the wavelength range of 600 nm to 1000 nm the extraordinary refractive index of the doped sapphire and the refractive index of the cladding glass differ from each other by at most 0.05, preferably at most 0.04, further preferably at most 0.03, further preferably at most 0.02, further preferably at most 0.01, further preferably at most 0.005, further preferably at most 0.0035.

In still further preferable embodiments the cladding glass with a thickness of 1 mm even in a wavelength range of 600 nm to 1100 nm has an internal transmission of at most 0.8, further preferably at most 0.5, further preferably at most 0.4, further preferably at most 0.3, further preferably at most 0.2, further preferably at most 0.15, further preferably at most 0.1, and for radiation in the wavelength range of 600 nm to 1100 nm the extraordinary refractive index of the doped sapphire and the refractive index of the cladding glass differ from each other by at most 0.05, preferably at most 0.04, further preferably at most 0.03, further preferably at most 0.02, further preferably at most 0.01, further preferably at most 0.005, further preferably at most 0.0035.

Preferably, the thickness of the cladding glass required for absorption of 99% of light (in particular parasitic laser light) having a wavelength of 800 nm is at most 10 mm, more preferred at most 9 mm, more preferred at most 8 mm, more preferred at most 7 mm, more preferred at most 6 mm, more preferred at most 5 mm, more preferred at most 4 mm. Preferably, the thickness of the cladding glass required for absorption of 99% of light (in particular parasitic laser light) having a wavelength of 800 nm is 0.1 to 10 mm, more preferred 0.2 to 8 mm, more preferred 0.3 to 7 mm, more preferred 0.4 to 6 mm, more preferred 0.5 to 5 mm, 1 to 4 mm.

Preferably, the thickness of the cladding glass required for absorption of 99.9% of light (in particular parasitic laser light) having a wavelength of 800 nm is at most 20 mm, more preferred at most 15 mm, more preferred at most 13 mm, more preferred at most 11 mm, more preferred at most 10 mm, more preferred at most 9 mm. Preferably, the thickness of the cladding glass required for absorption of 99.9% of light (in particular parasitic laser light) having a wavelength of 800 nm is 0.4 to 20 mm, more preferred 0.5 to 15 mm, more preferred 0.7 to 13 mm, more preferred 1 to 11 mm, more preferred 2 to 10 mm, more preferred 3 to 9 mm.

Preferably, the cladding glass has an optical depth t of at least 1.0, more preferably at least 1.25, more preferably at least 1.5, more preferably at least 1.75, more preferably at least 2.0, more preferably at least 2.15, more preferably at least 2.25, more preferably at least 2.5 in the direction of the parasitic laser light.

DETAILED DESCRIPTION OF THE DISCLOSURE

Figure 1:
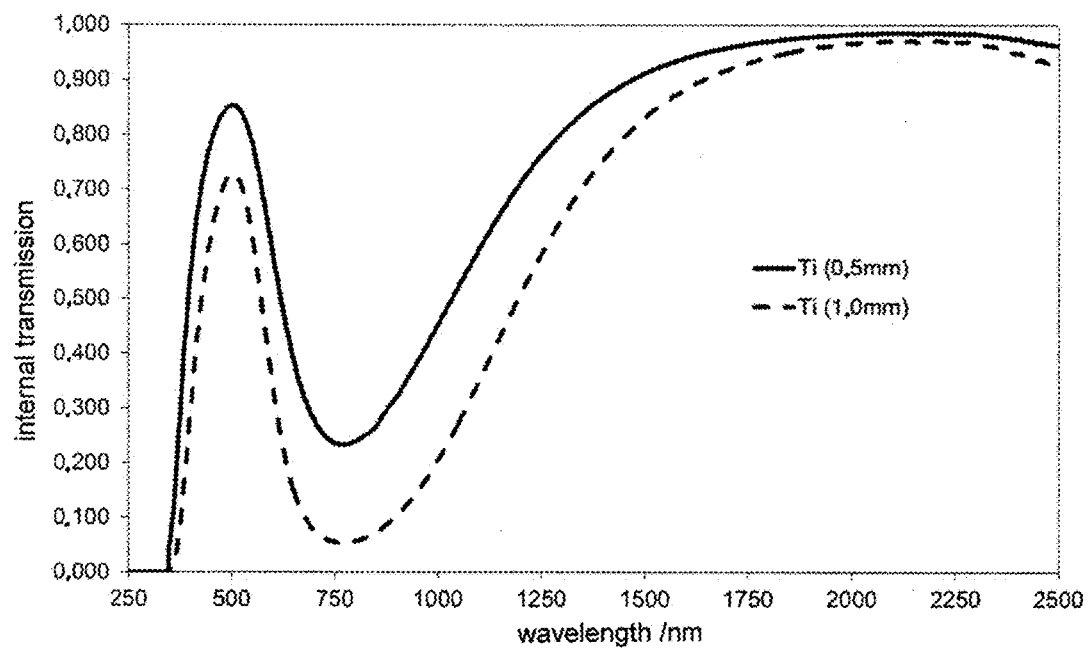
FIG. 1 shows curves of the internal transmission of an example of a cladding glass having different thickness.

Sapphire is characterized by a very high Abbe number. The Abbe number of sapphire is about $v_d$=73. This means that the dependency of the refractive indices (ordinary and extraordinary) on the wavelength is relatively low. So that the cladding glass is particularly well adjusted to the sapphire it is advantageous, when also the Abbe number of the cladding glass is very high. Preferably, therefore, the Abbe number of the glasses of the present disclosure is at least 35, further preferably at least 40, further preferably at least 45, further preferably at least 47, further preferably at least 48. Thus, the Abbe number of the glasses of the present disclosure is lower than the Abbe number of the sapphire, preferably, by at most 38, further preferably at most 33, further preferably at most 28, further preferably at most 26, further preferably at most 25. So a satisfactory adjustment of the refractive index of the glass to the refractive index of the sapphire over a comparatively large wavelength range becomes possible. Preferably, the Abbe number of the glasses of the present disclosure is not higher than 55, further preferably not higher than 52.

Formally, the refractive index (glass or sapphire) can be approximated to the wavelength $\lambda_0$ according to the formula of Taylor: $n(\lambda)=n(\lambda_0)+(\lambda-\lambda_0)*(\partial n(\lambda)/\partial \lambda)|_{\lambda_0}+\ldots$ . So that a good efficiency of the optical component can be guaranteed it is not only appropriate to adjust the refractive index of the glass close to the peak of the emission, but also the local differentiation of this refractive index $(\partial n(\lambda)/\partial \lambda)|_{\lambda_0}$ with respect to the wavelength at $\lambda_0$=800 [nm]. This characteristic value $(\partial n(\lambda)/\partial \lambda)|_{\lambda_0}$ indicates how good the adjustment of the refractive index in the intended wavelength range (for example from 750 nm to 850 nm) will become. For Ti:Sa this differentiation is ca. $-2.68\times10^{-5}$ [nm$^{-1}$]. For the glass a value of between $-3.00\times10^{-5}$ and $-6.00\times10^{-5}$ [nm$^{-1}$] is preferred. More preferably, for the glass the value is between $-3.00\times10^{-5}$ and $-4.00\times10^{-5}$ [nm$^{-1}$]. In alternative embodiments, for the glass the value is between $-5.00\times10^{-5}$ and $-6.00\times10^{-5}$ [nm$^{-1}$].

The laser component of the present disclosure comprises a core of doped sapphire. Preferably, the sapphire is doped with a dopant which is selected from the group consisting of ions of the elements titanium, chromium, iron and vanadium. Further preferably, the dopant is selected from the group consisting of ions of the elements titanium and chromium. It is particularly preferable, when the dopant is a titanium ion. Preferably, the proportion of the dopant oxide (e.g. $Ti_2O_3$) is in a range of 0.01 to 1% by weight, further preferably 0.05 to 0.5% by weight, further preferably 0.05 to 0.3% by weight, further preferably 0.1 to 0.2% by weight, based on the mass of the aluminum oxide ($Al_2O_3$) in the doped sapphire. With such proportions of dopants particularly efficient laser media are obtained.

The cladding glass being placed on the core with a thickness of 1 mm in a wavelength range of $\lambda=750$ nm to $\lambda=850$ nm preferably has an internal transmission of at most 0.8. Preferably, the internal transmission of the cladding glass with a thickness of 1 mm in a wave length range of 750 nm to 850 nm is even only at most 0.5, further preferably at most 0.4, further preferably at most 0.3, further preferably at most 0.2, further preferably at most 0.15, further preferably at most 0.1. A low internal transmission is connected with a high absorption of the parasitic laser light in the cladding glass so that the proportion of the light which from the cladding glass again enters the doped sapphire is considerably reduced.

Preferably, the cladding glass being placed on the core with a thickness of 1 mm in a wavelength range of $\lambda=700$ nm to $\lambda=900$ nm has an internal transmission of at most 0.8, further preferably at most 0.5, further preferably at most 0.4, further preferably at most 0.3, further preferably at most 0.2, further preferably at most 0.15, further preferably at most 0.1.

Preferably, the cladding glass being placed on the core with a thickness of 1 mm in a wavelength range of $\lambda=650$ nm to $\lambda=950$ nm has an internal transmission of at most 0.8, further preferably at most 0.5, further preferably at most 0.4, further preferably at most 0.3, further preferably at most 0.2, further preferably at most 0.15, further preferably at most 0.1.

Preferably, the cladding glass being placed on the core with a thickness of 1 mm in a wavelength range of $\lambda=600$ nm to $\lambda=1000$ nm has an internal transmission of at most 0.8, further preferably at most 0.5, further preferably at most 0.4, further preferably at most 0.3, further preferably at most 0.2, further preferably at most 0.15, further preferably at most 0.1.

Preferably, the cladding glass being placed on the core with a thickness of 1 mm in a wavelength range of $\lambda=600$ nm to $\lambda=1100$ nm has an internal transmission of at most 0.8, further preferably at most 0.5, further preferably at most 0.4, further preferably at most 0.3, further preferably at most 0.2, further preferably at most 0.15, further preferably at most 0.1.

At other wavelengths, the cladding glass preferably has a significant lowest internal transmission. Preferably, the cladding glass being placed on the core with a thickness of 1 mm in a wavelength range of $\lambda=450$ nm to $\lambda=550$ nm has an internal transmission of at least 0.4, further preferably at least 0.5, further preferably at least 0.6.

In alternative embodiments, the cladding glass being placed on the core with a thickness of 1 mm in a wavelength range of $\lambda=1025$ nm to $\lambda=1125$ nm has an internal transmission of at least 0.2, further preferably at least 0.25, further preferably at least 0.3.

In FIG. 1 internal transmission curves of a preferable cladding glass example are shown.

The difference between the extraordinary refractive index of the doped sapphire and the refractive index of the cladding glass for radiation in the wavelength range of 750 nm to 850 nm is at most 0.05. Preferably, the difference between the extraordinary refractive index of the doped sapphire and the refractive index of the cladding glass for radiation in the wavelength range of 750 nm to 850 nm is at most 0.04, further preferably at most 0.03, further preferably at most 0.02, further preferably at most 0.01, further preferably at most 0.005, further preferably at most 0.002, further preferably at most 0.001, further preferably at most 0.0005. A low difference between the mentioned refractive indices is connected with a low reflection at the boundary surface sapphire crystal/cladding glass so that a particularly high proportion of the parasitic laser light from the doped sapphire can enter the cladding glass.

Preferably, the difference between the extraordinary refractive index of the doped sapphire and the refractive index of the cladding glass for radiation in the wavelength range of 700 nm to 900 nm is at most 0.05, further preferably at most 0.04, further preferably at most 0.03, further preferably at most 0.02, further preferably at most 0.01, further preferably at most 0.005, further preferably at most 0.002, further preferably at most 0.0015.

Preferably, the difference between the extraordinary refractive index of the doped sapphire and the refractive index of the cladding glass for radiation in the wavelength range of 650 nm to 950 nm is at most 0.05, further preferably at most 0.04, further preferably at most 0.03, further preferably at most 0.02, further preferably at most 0.01, further preferably at most 0.005, further preferably at most 0.0025.

Preferably, the difference between the extraordinary refractive index of the doped sapphire and the refractive index of the cladding glass for radiation in the wavelength range of 600 nm to 1000 nm is at most 0.05, further preferably at most 0.04, further preferably at most 0.03, further preferably at most 0.02, further preferably at most 0.01, further preferably at most 0.005, further preferably at most 0.0035.

Preferably, the difference between the extraordinary refractive index of the doped sapphire and the refractive index of the cladding glass for radiation in the wavelength range of 600 nm to 1100 nm is at most 0.05, further preferably at most 0.04, further preferably at most 0.03, further preferably at most 0.02, further preferably at most 0.01, further preferably at most 0.005, further preferably at most 0.0035.

Preferably, the extraordinary refractive index of the doped sapphire for radiation in the wavelength range of 750 nm to 850 nm is in a range of 1.70 to 1.80, further preferably 1.72 to 1.78, further preferably 1.73 to 1.77, further preferably 1.74 to 1.77. It is particularly preferable, when the extraordinary refractive index of the doped sapphire for radiation in the wavelength range of 750 nm to 850 nm is about 1.75. Therefore, according to the present disclosure, the refractive index of the cladding glass for radiation in the wavelength range of 750 nm to 850 nm is preferably in a range of 1.65 to 1.85, further preferably 1.67 to 1.83, further preferably 1.68 to 1.82, further preferably 1.69 to 1.82, further preferably 1.70 to 1.80, further preferably 1.72 to 1.78, further preferably 1.73 to 1.77, further preferably 1.74 to 1.77, further preferably 1.750 to 1.765, further preferably 1.750 to 1.760. It is particularly preferable, when the refractive index of the cladding glass for radiation in the wavelength range of 750 nm to 850 nm is about 1.755.

Preferably, the extraordinary refractive index of the doped sapphire for radiation in the wavelength range of 700 nm to 900 nm is in a range of 1.70 to 1.80, further preferably 1.72 to 1.78, further preferably 1.73 to 1.77, further preferably 1.74 to 1.77. It is particularly preferable, when the extraordinary refractive index of the doped sapphire for radiation in the wavelength range of 700 nm to 900 nm is about 1.75. Therefore, according to the present disclosure, the refractive index of the cladding glass for radiation in the wavelength range of 700 nm to 900 nm is preferably in a range of 1.65 to 1.85, further preferably 1.67 to 1.83, further preferably 1.68 to 1.82, further preferably 1.69 to 1.82, further preferably 1.70 to 1.80, further preferably 1.72 to 1.78, further preferably 1.73 to 1.77, further preferably 1.74 to 1.77, further preferably 1.750 to 1.765, further preferably 1.750 to 1.760. It is particularly preferable, when the refractive index of the cladding glass for radiation in the wavelength range of 700 nm to 900 nm is about 1.755.

Preferably, the extraordinary refractive index of the doped sapphire for radiation in the wavelength range of 650 nm to 950 nm is in a range of 1.70 to 1.80, further preferably 1.72 to 1.78, further preferably 1.73 to 1.77, further preferably 1.74 to 1.77. It is particularly preferable, when the extraordinary refractive index of the doped sapphire for radiation in the wavelength range of 650 nm to 950 nm is about 1.75. Therefore, according to the present disclosure, the refractive index of the cladding glass for radiation in the wavelength range of 650 nm to 950 nm is preferably in a range of 1.65 to 1.85, further preferably 1.67 to 1.83, further preferably 1.68 to 1.82, further preferably 1.69 to 1.82, further preferably 1.70 to 1.80, further preferably 1.72 to 1.78, further preferably 1.73 to 1.77, further preferably 1.74 to 1.77, further preferably 1.750 to 1.765, further preferably 1.750 to 1.760. It is particularly preferable, when the refractive index of the cladding glass for radiation in the wavelength range of 650 nm to 950 nm is about 1.755.

Preferably, the extraordinary refractive index of the doped sapphire for radiation in the wavelength range of 600 nm to 1000 nm is in a range of 1.70 to 1.80, further preferably 1.72 to 1.78, further preferably 1.73 to 1.77, further preferably 1.74 to 1.77. It is particularly preferable, when the extraordinary refractive index of the doped sapphire for radiation in the wavelength range of 600 nm to 1000 nm is about 1.75. Therefore, according to the present disclosure, the refractive index of the cladding glass for radiation in the wavelength range of 600 nm to 1000 nm is preferably in a range of 1.65 to 1.85, further preferably 1.67 to 1.83, further preferably 1.68 to 1.82, further preferably 1.69 to 1.82, further preferably 1.70 to 1.80, further preferably 1.72 to 1.78, further preferably 1.73 to 1.77, further preferably 1.74 to 1.77, further preferably 1.750 to 1.765, further preferably 1.750 to 1.760. It is particularly preferable, when the refractive index of the cladding glass for radiation in the wavelength range of 600 nm to 1000 nm is about 1.755.

Preferably, the extraordinary refractive index of the doped sapphire for radiation in the wavelength range of 600 nm to 1100 nm is in a range of 1.70 to 1.80, further preferably 1.72 to 1.78, further preferably 1.73 to 1.77, further preferably 1.74 to 1.77. It is particularly preferable, when the extraordinary refractive index of the doped sapphire for radiation in the wavelength range of 600 nm to 1100 nm is about 1.75. Therefore, according to the present disclosure, the refractive index of the cladding glass for radiation in the wavelength range of 600 nm to 1100 nm is preferably in a range of 1.65 to 1.85, further preferably 1.67 to 1.83, further preferably 1.68 to 1.82, further preferably 1.69 to 1.82, further preferably 1.70 to 1.80, further preferably 1.72 to 1.78, further preferably 1.73 to 1.77, further preferably 1.74 to 1.77, further preferably 1.750 to 1.765, further preferably 1.750 to 1.760. It is particularly preferable, when the refractive index of the cladding glass for radiation in the wavelength range of 600 nm to 1100 nm is about 1.755.

In particular embodiments, the difference between the refractive index of the cladding glass and the mean value of the ordinary and the extraordinary refractive indices of the doped sapphire for radiation in the wavelength range of 750 nm to 850 nm is at most 0.05, preferably at most 0.04, further preferably at most 0.03, further preferably at most 0.02, further preferably at most 0.01, further preferably at most 0.005, further preferably at most 0.002, further preferably at most 0.001, further preferably at most 0.0005.

In particular embodiments, the difference between the refractive index of the cladding glass and the mean value of the ordinary and the extraordinary refractive indices of the doped sapphire for radiation in the wavelength range of 700 nm to 900 nm is at most 0.05, preferably at most 0.04, further preferably at most 0.03, further preferably at most 0.02, further preferably at most 0.01, further preferably at most 0.005, further preferably at most 0.002, further preferably at most 0.0015.

In particular embodiments, the difference between the refractive index of the cladding glass and the mean value of the ordinary and the extraordinary refractive indices of the doped sapphire for radiation in the wavelength range of 650 nm to 950 nm is at most 0.05, preferably at most 0.04, further preferably at most 0.03, further preferably at most 0.02, further preferably at most 0.01, further preferably at most 0.005, further preferably at most 0.002, further preferably at most 0.0025.

In particular embodiments, the difference between the refractive index of the cladding glass and the mean value of the ordinary and the extraordinary refractive indices of the doped sapphire for radiation in the wavelength range of 600 nm to 1000 nm is at most 0.05, preferably at most 0.04, further preferably at most 0.03, further preferably at most 0.02, further preferably at most 0.01, further preferably at most 0.005, further preferably at most 0.002, further preferably at most 0.0035.

In particular embodiments, the difference between the refractive index of the cladding glass and the mean value of the ordinary and the extraordinary refractive indices of the doped sapphire for radiation in the wavelength range of 600 nm to 1100 nm is at most 0.05, preferably at most 0.04, further preferably at most 0.03, further preferably at most 0.02, further preferably at most 0.01, further preferably at most 0.005, further preferably at most 0.002, further preferably at most 0.0035.

Preferably, the difference between the extraordinary refractive index of the doped sapphire and the ordinary refractive index of the doped sapphire for radiation in the wavelength range of 750 nm to 850 nm, further preferably of 700 nm to 900 nm, further preferably of 650 nm to 950 nm, further preferably of 600 nm to 1000 nm, further preferably of 600 nm to 1100 nm is at most 0.01. Preferably, the difference is in a range of 0.008 to 0.009. Therefore, the difference between the mean value of the ordinary and the extraordinary refractive indices of the doped sapphire and the extraordinary refractive index of the doped sapphire is preferably at most 0.005.

Preferably, the refractive index in the wavelength range of 600 nm to 1100 nm is determined by means of a prism coupler. In an alternative, the refractive index can also be determined at lower wavelengths by means of a V-block refractometer and the refractive index in the wavelength range of 600 nm to 1100 nm can be extrapolated with the help of the dispersion formulas of Sellmeier and/or Hartmann. In the case of CuO, doping dependently on its intensity also other methods for determining the refractive index can be used.

The cladding glass is placed on the core. For effectively suppressing the parasitic laser light it is advantageous, when the cladding glass is at least arranged on large parts of the surface proportions of the doped sapphire at which the parasitic laser light may potentially exit from the doped sapphire. Here, in particular, the surface proportions of the doped sapphire are meant the normal vector of which, generally, is parallel to the propagation direction of the parasitic laser light. Parasitic laser light propagates in all directions. But the amplification of this parasitic light is particularly high in particular in an orthogonal direction with respect to the preferred laser direction and an orthogonal direction with respect to the crystallographic axis c.

There are two opposing directions which fulfil these conditions. Therefore it is advantageous, when the cladding glass is arranged on the surface of the doped sapphire such that it is capable of facilitating the exit of the parasitic laser light from the sapphire crystal on both sides, the said one side and also the said opposite side of the doped sapphire. In contrast, at the side at which the laser light with the preferred orientation can exit the doped sapphire no cladding glass should be present, because there an undisturbed exit of the laser light is desired. At the remaining side areas of the doped sapphire at which less parasitic laser light can exit from the crystal a cladding glass can be arranged on the doped sapphire. This, however, is connected with a considerably smaller advantage and will normally result in additional costs so that at these sides of the doped sapphire preferably no cladding glass is present.

FIG. 2 shows a preferable arrangement of cladding glass on opposite sides of a doped sapphire crystal in an exemplary and schematic manner.

Figures 2A, 2B, 2C:
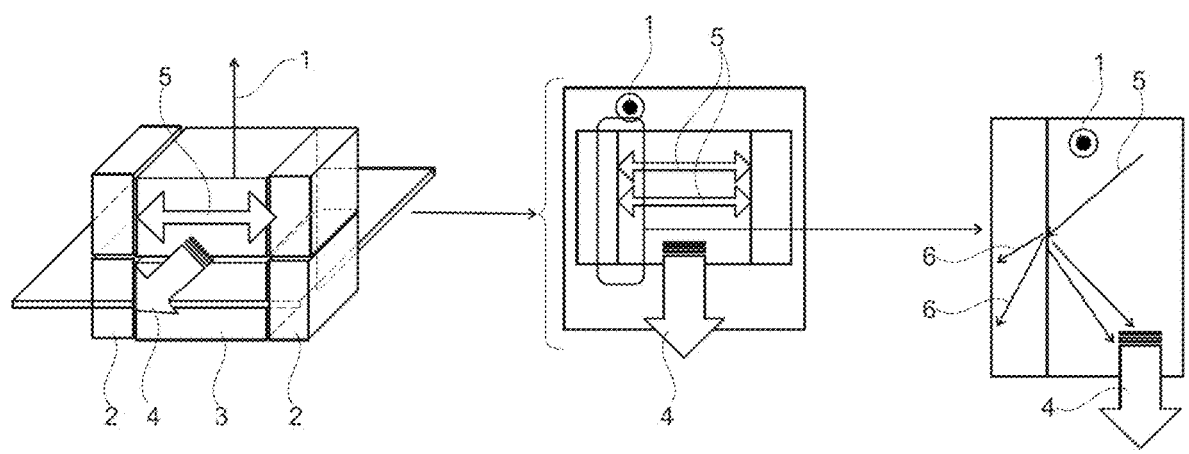
FIGS. 2a, 2b, and 2c schematically shows a preferred arrangement of the cladding glass on the doped sapphire.

In FIG. 2a) a schematic 3D view of a doped sapphire crystal 3 with cladding glasses 2 arranged on opposite sides of the crystal 3 is shown. The cladding glass 2 is arranged on the surface of the doped sapphire 3 such that it is capable of facilitating the exit of the parasitic laser light 5 from the sapphire crystal on both sides, the said one side and also the said opposite side of the doped sapphire 3. In contrast, at the side at which the laser light with the preferred orientation 4 can exit from the doped sapphire 3 no cladding glass 2 is present so that there an undisturbed exit of the laser light 4 from the sapphire crystal 3 can take place. For both, the laser light with the preferred direction 4 and also the parasitic laser light 5 the directions of the highest amplification, orthogonal to the crystallographic axis c (reference sign 1) of the sapphire crystal, are shown. In FIG. 2a) in addition a virtual sectional plane is shown. In FIGS. 2b) and 2c) a view onto this virtual sectional plane is shown.

In FIG. 2b) the propagation of the laser light with the preferred direction 4 and the parasitic laser light 5, orthogonal to the crystallographic c axis 1 of the sapphire crystal, is shown.

FIG. 2c) shows an enlarged view of the boundary surface between cladding glass (left) and doped sapphire (right). Portions of the parasitic laser light 5 from the sapphire enter the cladding glass. In FIG. 2c) these proportions are signified with the reference sign 6. By the absorption of these proportions 6 of the parasitic laser light 5 in the cladding glass the parasitic laser light can efficiently be suppressed and thus the laser power can be increased.

Since the cladding glass is present on the doped sapphire, in the case of temperature changes tensions may occur, when the cladding glass and the doped sapphire are characterized by extremely different thermal expansion behavior. Such tensions may result in peeling off of the cladding or even in breakage. Therefore it is advantageous, when the coefficient of linear thermal expansion of the cladding glass is adjusted to the coefficient of linear thermal expansion of the doped sapphire.

The coefficient of linear longitudinal thermal expansion is defined as: $\alpha(T)=(1/L)*(\partial L/\partial T)$, wherein L is the length of the measuring sample and T is the temperature.

In this document, the mean coefficient of linear longitudinal thermal expansion in a certain temperature range, e.g. $[T_0;T_0+\Delta T]$, is defined as follows: $<\alpha>_{[T_0;T_0+\Delta T]}=1/(\Delta T)\int_{T_0}^{T_0+\Delta T}\alpha(T)dT$ For the purpose of simplification in the following part of this text the measuring values $<\alpha>$ refer to the mean coefficient of linear longitudinal thermal expansion in the range of $[-30; 70]°$ C.

But in this case it has to be considered that the sapphire due to its crystallographic anisotropy is characterized by two coefficients of linear longitudinal thermal expansion, wherein one is defined for the preferential directions being parallel to the crystallographic axis c ($<\alpha_{sapphire}>_{//c}$) and one is defined for the preferential directions being orthogonal to the crystallographic axis c ($<\alpha_{sapphire}>\perp_c$).

$<\alpha_{sapphire}>_{//c}$=mean coefficient of linear longitudinal thermal expansion of sapphire for the preferential directions being parallel to the crystallographic axis c $<\alpha_{sapphire}>\perp_c$=mean coefficient of linear longitudinal thermal expansion of sapphire for the preferential directions being orthogonal to the crystallographic axis c $<\alpha_{sapphire}>$=mean value of the mean coefficient of linear longitudinal thermal expansion of sapphire for the preferential directions being parallel to the crystallographic axis c and the mean coefficient of linear longitudinal thermal expansion for the preferential directions being orthogonal to the crystallographic axis c.

The following is true: $<\alpha_{sapphire}>=(<\alpha_{sapphire}>_{//c}+<\alpha_{sapphire}>\perp_c)/2$ Both values $<\alpha_{sapphire}>\perp_c$ and $<\alpha_{sapphire}>_{//c}$ are different. Since the cladding glass is preferably present on a predominant proportion of the surface proportions of the doped sapphire the normal vector of which being parallel to the propagation direction of the parasitic laser light, both, the differences between the coefficient of linear longitudinal thermal expansion of the cladding glass $<\alpha_{glass}>$ and the $<\alpha_{sapphire}>_{//c}$ and also the differences between the $<\alpha_{glass}>$ and the $<\alpha_{sapphire}>\perp_c$ contribute to the temperature-dependent tensions between the doped sapphire and the cladding glass which is present thereon. Therefore it is advantageous, when the difference between the value $<\alpha_{glass}>$ and the mean value of the values $<\alpha_{sapphire}>_{//c}$ and $<\alpha_{sapphire}>\perp_c$ (in other words $<\alpha_{sapphire}>=(<\alpha_{sapphire}>_{//c}+<\alpha_{sapphire}>\perp_c)/2$) is small.

An advantageous measure for the linear thermal expansion of the cladding glass is $<\alpha_{glass}>$. Therefore, preferably, the difference between $<\alpha_{glass}>$ and $<\alpha_{sapphire}>=(<\alpha_{sapphire}>_{//c}+<\alpha_{sapphire}>\perp_c)/2$ is at most $0.5*10^{-6}$ K$^{-1}$, further preferably at most $0.3*10^{-6}$ K$^{-1}$, further preferably at most $0.2*10^{-6}$ K$^{-1}$, further preferably at most $0.1*10^{-6}$ K$^{-1}$.

In a temperature range of −30° C. to 70° C. the value $<\alpha_{sapphire}>$ is about $5.8*10^{-6}$ K$^{-1}$. Therefore, in a temperature range of −30° C. to 70° C. $<\alpha_{glass}>$ is preferably in a range of $4.5*10^{-6}$ K$^{-1}$ to $7.0*10^{-6}$ K$^{-1}$, further preferably $5.0*10^{-6}$ K$^{-1}$ to $6.5*10^{-6}$ K$^{-1}$, further preferably $5.2*10^{-6}$ K$^{-1}$ to $6.4*10^{-6}$ K$^{-1}$, further preferably $5.5*10^{-6}$ K$^{-1}$ to $6.0*10^{-6}$ K$^{-1}$, further preferably $5.7*10^{-6}$ K$^{-1}$ to $5.9*10^{-6}$ K$^{-1}$. It is particularly preferable, when in a temperature range of −30° C. to 70° C. the value $<\alpha_{glass}>$ is about $5.8*10^{-6}$ K$^{-1}$.

The inventors have found that silicate glass or aluminosilicate glass containing an absorption component is particularly well suitable as cladding glass for doped sapphire. Silicate glass has the distinction of containing $SiO_2$ as network former, whereas aluminosilicate glass contains $SiO_2$ and $Al_2O_3$ as network formers. Particularly preferred refractive index increasing components are $TiO_2$ and/or PbO. Preferred absorption components of the disclosure are selected from the group consisting of CoO, $Fe_2O_3$, NiO, $V_2O_5$, CrO, MnO and $SeO_2$. However, other glass matrices, other refractive index increasing components and/or other absorption components work as well as described in more detail below. For example, borosilicate glasses may be used, however, preferably not in combination with CuO as absorption component. CuO may be used as absorption component in addition or as an alternative to the absorption components described above, however, preferably in glasses comprising $SiO_2$ in amount of more than 15% by weight, for example at least 20% by weight.

Preferably, the cladding glass comprises $La_2O_3$ in a proportion of 0 to 5% by weight, more preferably 0 to 2% by weight, more preferably 0 to 1% by weight. This refers in particular to embodiments in which other refractive index increasing components such as for example $TiO_2$ or PbO are used in addition or alternative to $La_2O_3$. In such embodiments, the cladding glass is preferably free of $La_2O_3$. Alternatively, the cladding glass may comprise $La_2O_3$ in a proportion of 30 to 60% by weight. $La_2O_3$ may be used for increasing the refractive index. The prom portion of $La_2O_3$ may be at least 35% by weight, further preferably at least 40% by weight. But when the proportion of $La_2O_3$ is too high, then the risk of crystallization increases. Therefore, the proportion of $La_2O_3$ is preferably at most 55% by weight. $La_2O_3$ is preferably used in embodiments comprising CuO as absorption component and/or in glasses comprising $SiO_2$ in an amount of more than 15% by weight, for example at least 20% by weight.

As described above, the glasses of the present disclosure are preferably silicate glasses or aluminosilicate glasses. In particular in embodiments in which the cladding glass comprises only low amounts of $La_2O_3$ or is even free of $La_2O_3$, the proportion of $B_2O_3$ in the cladding glass is preferably 0 to 5% by weight, more preferably 0 to 2% by weight, more preferably 0 to 1% by weight. The cladding glass may also be free of $B_2O_3$. However, $B_2O_3$ may be used as a network former and may be present in the cladding glass in amounts of 15 to 45% by weight in some embodiment. In some circumstances however it is possible that $B_2O_3$ during the step of melting leaks out so that glass compositions with very high content of $B_2O_3$ and thus also the physical and chemical glass properties dependently on the process conditions are the subject of undesired fluctuations with respect to the exact composition (e.g. due to evaporation during the melt). A proportion of $B_2O_3$ which is too high can make the glass more susceptible to aqueous corrosion. Furthermore, a proportion of $B_2O_3$ which is too high makes the glass shorter (a technical term which relates to glasses), i.e. that within a very small temperature range the viscosity changes much which is disadvantageous for the process calibration. Furthermore, high proportions of $B_2O_3$ are connected with a reduction of the refractive index which, according to the present disclosure, is not desired. Therefore, preferably, the proportion of $B_2O_3$ in the cladding glass is at most 40% by weight, further preferably at most 35% by weight. But the proportion of $B_2O_3$ in the cladding glass should also not be very low, since otherwise the tendency to crystallization increases. In some embodiments, the proportion of $B_2O_3$ in the cladding glass is at least 20% by weight, further preferably at least 25% by weight.

As described above, the glass of the disclosure may be an aluminosilicate glass. Thus, the cladding glass may comprise $Al_2O_3$, for example in an amount of at least 0.1% by weight, at least 0.5% by weight, at least 1% by weight, at least 1.5% by weight or even at least 2% by weight. The proportion of $Al_2O_3$ in the cladding glass is preferably 0 to 10% by weight, more preferably 0 to 5% by weight, more preferably 0 to 3% by weight, more preferably 0 to 2% by weight, more preferably 0 to 1% by weight. In some embodiments, the cladding glass is free of $Al_2O_3$.

$SiO_2$ is a network former and it is preferably present in the cladding glass in amounts of 1 to 40% by weight, more preferably 2 to 39% by weight, more preferably 3 to 38% by weight, more preferably 4 to 37% by weight, more preferably 5 to 36% by weight. Preferably, the proportion of $SiO_2$ in the cladding glass is at most 35% by weight, further preferably at most 34% by weight, further preferably at most 32% by weight. However, $SiO_2$ makes a contribution to the improvement of the chemical stability of the cladding glasses. In addition, $SiO_2$ makes the glass longer, i.e. that the viscosity of the glass does not so strongly change dependent on the temperature, which is advantageous for the calibration of the production process. Therefore, the proportion of $SiO_2$ in the cladding glass is preferably at least 10% by weight, further preferably more than 15% by weight. In particular embodiments of the disclosure, the proportion of $SiO_2$ in the glass is at least 17.5% by weight, more preferably at least 20% by weight, more preferably at least 22.5% by weight, more preferably at least 25% by weight.

Preferably, the sum of the proportions of $SiO_2$ and $B_2O_3$ in the cladding glass is at most 60% by weight, further preferably at most 50% by weight, further preferably at most 45% by weight, further preferably at most 40% by weight, further preferably at most 35% by weight, further preferably at most 34% by weight, further preferably at most 33% by weight, further preferably at most 30% by weight. Since these two network formers make a contribution to the reduction of the refractive index, the sum of these two components should not be too high, since this may be disadvantageous for the adjustments of the optical properties of the glass. However, in order for an advantageous network to be formed, the sum of the proportions of $SiO_2$ and $B_2O_3$ in the cladding glass is preferably at least 15% by weight, more preferably at least 20% by weight, more preferably at least 25% by weight, more preferably at least 27.5% by weight.

$ZrO_2$ may be contained in the cladding glass in a proportion of 0 to 15% by weight. With $ZrO_2$ the optical position of the glass (in the Abbe diagram) can be adjusted, in other words $ZrO_2$ allows the adjustment of the refractive index and the Abbe number. In addition, $ZrO_2$ increases the chemical stability of the glass against aqueous corrosion. Therefore, the cladding glass may contain $ZrO_2$ in a proportion of at least 1% by weight, at least 2% by weight, at least 3% by weight, or at least 5% by weight. But the proportion of $ZrO_2$ should also not be very high, since $ZrO_2$ increases the tendency to crystallization of the glass. $ZrO_2$ crystallizes relatively quickly and easily forms stoichiometric phases. In addition, it is difficult to melt $ZrO_2$ and already few residual crystals can increase the tendency to crystallization of the glass, in particular in the case of cooling. Therefore, the proportion of $ZrO_2$ is preferably at most 15% by weight, further preferably at most 12% by weight, further preferably at most 10% by weight. In particular embodiments, the proportion of $ZrO_2$ is preferably at most 5% by weight, further preferably at most 2% by weight, further preferably at most 1% by weight. The cladding glass of the disclosure may even be free of $ZrO_2$.

The cladding glasses may contain $Y_2O_3$ in amounts of 0 to 15% by weight. For example, the proportion of $Y_2O_3$ may be at least 0.25% by weight, or at least 0.5% by weight. Preferably, the proportion of $Y_2O_3$ is at most 12% by weight, further preferably at most 10% by weight, further preferably at most 9% by weight, further preferably at most 7% by weight, further preferably at most 5% by weight, further preferably at most 3% by weight, further preferably at most 1% by weight. High proportions of $Y_2O_3$ are connected with an increased tendency to crystallization of the glass. Therefore, the cladding glass of the disclosure is preferably free of $Y_2O_3$.

The component $Nb_2O_5$ is preferably contained in the cladding glass in a proportion of 0 to 15% by weight, more preferably 0 to 12% by weight, more preferably 0 to 10% by weight, more preferably 0 to 5% by weight. Preferably, the proportion of $Nb_2O_5$ is at least 0.1% by weight, further preferably at least 0.2% by weight. Preferably, the proportion of $Nb_2O_5$ is at most 3% by weight, further preferably at most 2% by weight, further preferably at most 1.7% by weight, further preferably at most 1.5% by weight, further preferably at most 1% by weight. High proportions of $Nb_2O_5$ are connected with an increased tendency to crystallization of the glass. The cladding glass of the disclosure may be free of $Nb_2O_5$.

$Y_2O_3$ and $Nb_2O_5$ may be used for the adjustment of a high refractive index. In addition, these two components due to their different effects onto the Abbe number can be combined for maximizing the Abbe number. In some embodiments, $Y_2O_3$ and $Nb_2O_5$ may be used in combined amounts of at least 1% by weight, at least 2% by weight, at least 5% by weight or at least 8% by weight. But is has to be considered that the amounts in which these components are used have to be limited, because too high amounts may result in an increase of the tendency to crystallization of the glass. It was shown that $Y_2O_3$ and $Nb_2O_5$ are preferably used in combined amounts up to 20 percent by weight, further preferably up to 18 percent by weight, further preferably up to 15 percent by weight, further preferably up to 12 percent by weight and most preferably up to 10 percent by weight. Also, it has to be considered that these components mentioned here are very expensive, and also due to this reason the amount used should be limited. In some embodiments, $Y_2O_3$ and $Nb_2O_5$ may be used in combined amounts of at most 5% by weight, at most 2% by weight or at most 1% by weight. The glasses of the disclosure may even be free of both $Y_2O_3$ and $Nb_2O_5$.

A high refractive index may be achieved by components such as for example $TiO_2$ or PbO as described below. Other components such as $La_2O_3$, $ZrO_2$, $Nb_2O_5$ and $Y_2O_3$ may also be used additionally or alternatively. However, $La_2O_3$, $ZrO_2$, $Nb_2O_5$ and $Y_2O_3$ are less preferred. The disclosure comprises embodiments in which the sum of the proportions of the components $La_2O_3$, $ZrO_2$, $Nb_2O_5$ and $Y_2O_3$ in the cladding glass is 0 to 15% by weight, 0 to 12% by weight, 0 to 10% by weight, 0 to 5% by weight, 0 to 2% by weight or even 0 to 1% by weight. The cladding glass of the disclosure may even be free of $La_2O_3$, $ZrO_2$, $Nb_2O_5$ and $Y_2O_3$. In some embodiments, the sum of the proportions of the components $La_2O_3$, $ZrO_2$, $Nb_2O_5$ and $Y_2O_3$ in the cladding glass may be at least 30% by weight, further preferably at least 40% by weight, further preferably at least 45% by weight, further preferably at least 47% by weight, further preferably at least 50% by weight, further preferably at least 55% by weight, so that a high refractive index is achieved.

Alkali oxides are preferably used in amounts of up to 25% by weight, more preferably up to 20% by weight, for example at least 0.1% by weight or at least 0.2% by weight. This refers in particular to embodiments comprising $TiO_2$, in particular to glasses having a comparably high amount of $TiO_2$, for example glasses comprising $TiO_2$ in an amount of at least 1% by weight, at least 2% by weight, or at least 3% by weight, in particular at least 5% by weight, at least 10% by weight, at least 15% by weight, or even at least 20% by weight. In such embodiments the content of $Na_2O$ in the glasses of the disclosure is preferably at least 0.1% by weight, more preferably at least 0.2% by weight, more preferably 1 to 20% by weight, more preferably 5 to 15% by weight. In such embodiments, the content of $K_2O$ is preferably 1 to 10% by weight, more preferably 3 to 8% by weight. In such embodiments, the ratio of the content of $Na_2O$ (in % by weight) and the content of $K_2O$ (in % by weight) is preferably from 1:1 to 5:1, more preferably from 1.5:1 to 3:1. However, in certain embodiments, the sum of the proportions of the components $Li_2O$, $Na_2O$ and $K_2O$ in the cladding glass is preferably at most 5% by weight, further preferably at most 2% by weight, further preferably at most 1% by weight, further preferably at most 0.1% by weight. Alkali oxides reduce the chemical resistance of the glasses. In addition, they reduce the refractive index so that increased proportions of refractive index increasing components may be necessary for compensating this effect. In certain embodiments, the cladding glasses may therefore even be free of $Li_2O$, $Na_2O$ and $K_2O$.

The cladding glasses of the present disclosure may contain BaO. Preferably, the proportions of BaO in the cladding glasses are 0 to 15% by weight, more preferably 0 to 10% by weight, more preferably 0 to 8% by weight, more preferably 0 to 7% by weight, more preferably 0 to 5% by weight. BaO increases the refractive index of the glasses and is used for the adjustment of the dependency of the viscosity on the temperature. Preferably, the proportion of BaO in the cladding glass is at least 0.1% by weight, more preferably at least 0.2% by weight. But when very much BaO is used, then the viscosity is too high. Therefore, preferably, the proportion of BaO in the cladding glass is at most 3% by weight, further preferably at most 2% by weight, further preferably at most 1% by weight, further preferably at most 0.5% by weight. The glasses may even be free of BaO.

Preferably, the sum of the proportions of the components MgO, CaO, SrO and BaO in the cladding glass is at most 15% by weight, more preferably at most 10% by weight, further preferably at most 9% by weight, further preferably at most 8% by weight, further preferably at most 5% by weight, further preferably at most 2% by weight, further preferably at most 1% by weight, further preferably at most 0.5% by weight. In particular MgO dramatically increases the tendency to crystallization of the glass. The cladding glasses are preferably free of MgO, CaO and SrO.

According to some alternative embodiments, SrO is contained in the cladding glass according to the present disclosure in a proportion of at least 0.5% by weight, further preferably at least 0.75% by weight, further preferably at least 1% by weight. However, preferably, the cladding glass contains at most 2% by weight, further preferably at most 1.5% by weight of SrO. In more preferable embodiments, the glass even contains at most 1% by weight, further preferably at most 0.5% by weight, further preferably at most 0.1% by weight of SrO. It is particularly preferable, when the cladding glass is even free of SrO.

In addition, according to some alternative embodiments, the cladding glass preferably contains CaO in a proportion of at least 0.2% by weight, further preferably at least 0.5% by weight, further preferably at least 0.75% by weight, further preferably at least 1% by weight. Preferably, the glass contains CaO in a proportion of at most 10% by weight. In some embodiments the cladding glass even contains at most 1% by weight, further preferably at most 0.5% by weight, further preferably at most 0.1% by weight of CaO. The cladding glass may even be free of CaO.

The alkaline earth metals allow melting of the glass at a low temperature by the formation of eutectics. But these components make a contribution to the formation of stoichiometric phases and thus to the tendency to crystallization of the glass. Therefore, preferably, the ratio of the sum of the proportions by weight of the components MgO, CaO, SrO and BaO to the proportion by weight of $SiO_2$ in the cladding glass is at most 0.5, further preferably at most 0.2, further preferably at most 0.1.

Preferably, the cladding glass contains ZnO in a proportion of 0 to 30% by weight. ZnO may be used for the adjustment of the viscosity of the glass and for the reduction of the tendency to crystallization. But when ZnO is used, then, with changing temperature, the viscosity varies very strongly. In addition, in the case of a concentration of ZnO which is too high, the refractive index is reduced. Therefore, preferably, the content of ZnO is at most 27% by weight, further preferably at most 25% by weight, further preferably at most 20% by weight, further preferably at most 15% by weight, further preferably at most 9% by weight, preferably at most 8.5% by weight, further preferably at most 7% by weight, still further preferably at most 5% by weight, further preferably at most 2% by weight, further preferably at most 1% by weight. The cladding glass of the disclosure may also be free of ZnO. However, in some embodiments, the cladding glass preferably contains ZnO in a proportion of at least 0.5% by weight, further preferably at least 1% by weight, further preferably at least 2% by weight.

The glass of the present disclosure may preferably contain $TiO_2$ in amounts of 0 to 40% by weight, more preferably 0 to 35% by weight, more preferably 0 to 30% by weight, more preferably 0 to 25% by weight, more preferably to 0 to 20% by weight, more preferably 0 to 15% by weight, more preferably 0 to 10% by weight, more preferably 0 to 5% by weight. The proportion of $TiO_2$ in the glass may even be at most 4% by weight, at most 3% by weight, or at most 2% by weight. The content of $TiO_2$ may even be at most 1% by weight, or at most 0.1% by weight. In some embodiments it is even preferable, when the glasses are free of $TiO_2$. According to some alternative embodiments, preferably, the glass contains $TiO_2$ in a proportion of at least 0.5% by weight, further preferably at least 1% by weight, further preferably at least 1.5% by weight or at least 2% by weight, further preferably at least 5% by weight, further preferably at least 10% by weight, further preferably at least 15% by weight, further preferably at least 20% by weight, further preferably at least 25% by weight.

$P_2O_5$ compromises the water resistance of the glass so that the use of a cooling liquid on the surface of the cladding glass becomes more complicated or is even no longer possible at all. In addition, $P_2O_5$ reduces the refractive index and results in an increase of the coefficient of thermal expansion. Therefore, preferably, the cladding glass contains $P_2O_5$ in a proportion of at most 5% by weight, further preferably at most 2% by weight, further preferably at most 1% by weight, further preferably at most 0.5% by weight, further preferably at most 0.2% by weight, further preferably at most 0.1% by weight. In particularly preferable embodiments the glass is even free of $P_2O_5$.

PbO is a component which is less preferred, since PbO is harmful to the environment and hazardous to health. In addition, PbO results in the formation of streaks and thus compromises the homogeneity of the glass. PbO is also capable of attacking platinum crucibles so that such ones cannot be used for the production of the glass, when the proportion of PbO is too high. Preferably, the cladding glass contains PbO in a proportion of at most 70% by weight, more preferably at most 50% by weight, more preferably at most 20% by weight, more preferably at most 10% by weight, more preferably at most 5% by weight, further preferably at most 2% by weight, further preferably at most 1% by weight, further preferably at most 0.5% by weight, further preferably at most 0.2% by weight, further preferably at most 0.1% by weight.

In particularly preferable embodiments the glass is even free of PbO. In certain embodiments the cladding glass comprises PbO in a proportion of 50 to 70% by weight, more preferably 55 to 65% by weight.

Preferably, the glass according to the present disclosure contains one or more absorption components in a content of 0.1 to 10% by weight. Preferably, the total proportion of said one or more absorption components is 0.2 to 7% by weight, further preferably 0.3 to 5% by weight, further preferably 0.5 to 3% by weight, further preferably 0.7 to 2% by weight, further preferably 0.85 to 1.75% by weight, further preferably 1 to 1.5% by weight.

Said one or more absorption components are used for the absorption of the parasitic laser light having entered the cladding glass. Such absorption components may for example comprise transition metals such as Fe, V, Ni, Mn or Co. Preferably, the absorption components are selected from the group consisting of CoO, $Fe_2O_3$, NiO, $V_2O_5$, MnO, CrO and $SeO_2$, further preferably from the group consisting of CoO, NiO and CrO, further preferably from the group consisting of CoO and NiO. The absorption component NiO is particularly preferable.

Another absorption component that may be used is CuO. However, CuO should only be used in glasses comprising $SiO_2$ in amount of more than 15% by weight, for example at least 20% by weight of $SiO_2$ or at least 25% by weight of $SiO_2$. In such embodiments, the cladding glass preferably contains CuO in a proportion of 0 to 10% by weight. For example, the proportion of CuO in the cladding glass may be at least 0.1% by weight, at least 0.2% by weight, at least 0.3% by weight, at least 0.5% by weight, at least 0.7% by weight, further preferably at least 1% by weight. But the proportion of CuO should also not be extraordinarily high, since otherwise it is possible that the CuO is reduced to the metal Cu and thus it is possible that the glass contains colloid particles. These particles may result in strong absorption in the broad spectrum which is disadvantageous for the quality control, the detection of defects and the heat dissolution. In addition, high proportions of CuO also increase the tendency to crystallization of the glass. Therefore, preferably, the proportion of CuO in the cladding glass is at most 10% by weight, further preferably at most 7% by weight, further preferably at most 5% by weight, further preferably at most 3% by weight, further preferably at most 2% by weight, further preferably at most 1.5% by weight, further preferably at most 1.2% by weight.

Preferably, the cladding glass contains NiO in a proportion of 0 to 10% by weight. NiO was shown to be particularly advantageous for achieving an effective absorption of the parasitic laser light having entered the cladding glass. Therefore, preferably, the proportion of NiO in the cladding glass is at least 0.1% by weight, further preferably at least 0.2% by weight, further preferably at least 0.3% by weight, further preferably at least 0.5% by weight, further preferably at least 0.7% by weight, further preferably at least 1% by weight. But the proportion of NiO should also not be extraordinarily high, since otherwise it is possible that the NiO is reduced to the metal Ni and thus it is possible that the glass contains colloid particles. These particles may result in strong absorption in the broad spectrum which is disadvantageous for the quality control, the detection of defects and the heat dissolution. In addition, high proportions of NiO also increase the tendency to crystallization of the glass. Therefore, preferably, the proportion of NiO in the cladding glass is at most 10% by weight, further preferably at most 7% by weight, further preferably at most 5% by weight, further preferably at most 3% by weight, further preferably at most 2% by weight, further preferably at most 1.5% by weight, further preferably at most 1.2% by weight.

Generally, the glass of the present disclosure is suitable as a cladding glass. By the selection of the absorbing components the glass can be adjusted to the wavelength of the parasitic laser light. Such components which preferably can be used are, according to the present disclosure, CoO, $Fe_2O_3$, NiO, $V_2O_5$, MnO, CrO and $SeO_2$. Particularly preferable are CoO, NiO and CrO, more preferable are CoO and NiO. A particularly preferred absorption component is NiO. NiO may be used alone or together with other absorption components.

Preferably, the cladding glass can contain one or more of the components CoO, $Fe_2O_3$, $V_2O_5$, MnO, CrO and $SeO_2$ in a total proportion of 0 to 10% by weight. In some embodiments the total proportion of CoO, $Fe_2O_3$, $V_2O_5$, MnO, CrO and/or $SeO_2$ in the cladding glass is even at least 0.1% by weight, further preferably at least 0.2% by weight, further preferably at least 0.5% by weight, further preferably at least 0.7% by weight. But the proportion of CoO, $Fe_2O_3$, $V_2O_5$, MnO, CrO and/or $SeO_2$ should also not be extraordinarily high, since otherwise it is possible that CoO, $Fe_2O_3$, $V_2O_5$, MnO, CrO and/or $SeO_2$ are reduced to the corresponding metals and thus it is possible that the glass contains colloid particles. These particles may result in a strong absorption in the broad spectrum which is disadvantageous for the quality control, the detection of defects and the heat dissolution. In addition, high proportions of CoO, $Fe_2O_3$, $V_2O_5$, MnO, CrO and $SeO_2$ also increase the tendency to crystallization of the glass. Therefore, preferably, the total proportion of CoO, $Fe_2O_3$, $V_2O_5$, MnO, CrO and $SeO_2$ in the cladding glass is at most 10% by weight, further preferably at most 7% by weight, further preferably at most 5% by weight, further preferably at most 3% by weight, further preferably at most 2% by weight, further preferably at most 1.5% by weight. In preferable embodiments the total proportion of CoO, $Fe_2O_3$, $V_2O_5$, MnO, CrO and $SeO_2$ in the glass is even at most 1% by weight, further preferably at most 0.5% by weight, further preferably at most 0.1% by weight. It is particularly preferable, when the glass is even free of CoO, $Fe_2O_3$, $V_2O_5$, MnO, CrO and $SeO_2$.

Interestingly, it was found that the molar extinction coefficient $\varepsilon_\lambda$ of an absorption component is dependent on the glass matrix of the cladding glass. Preferably, an absorption component in a cladding glass of the disclosure has a molar extinction coefficient $\varepsilon_{\lambda=800\ nm}$ at a wavelength of 800 nm of 0.01 to 10 $(mm*mol\ \%)^{-1}$, more preferably of 0.05 to 5 $(mm*mol\ \%)^{-1}$, more preferably of 0.1 to 2 $(mm*mol\ \%)^{-1}$.

$As_2O_3$ and/or $Sb_2O_3$ may be used as preferred fining agents. Preferably, the proportion of $As_2O_3$ or $Sb_2O_3$ is 0 to 1% by weight, further preferably 0.1 to 0.5% by weight. In addition, $As_2O_3$ and $Sb_2O_3$ again absorb the gas and/or the oxygen being not dissolved in the glass. This reaction can be used for the adjustment of the redox state of the glass. This one also indirectly influences the absorption spectrum of the transition metals (for example NiO) so that with the use of $As_2O_3$ and/or $Sb_2O_3$ the absorption efficiency of the used absorption component can be controlled in a targeted manner.

On grounds of environmental compatibility the glasses are preferably free of components which are particularly harmful to the environment, in particularly they are preferably free of PbO, $Bi_2O_3$, $As_2O_3$ and $Sb_2O_3$.

In one embodiment, the cladding glass comprises the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof.

In one embodiment, the cladding glass comprises the following components (in % by weight):

| Component | Proportion (% by weight) |
|---|---|
| $SiO_2$ | 10 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0.1 to 25 |
| $TiO_2$ | 1 to 40 |
| $La_2O_3$ | 0 to 60 |
| $ZrO_2$ | 0 to 15 |
| $Nb_2O_5$ | 0 to 15 |

| Component | Proportion (% by weight) |
| --- | --- |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof.

In one embodiment, the cladding glass comprises the following components (in % by weight):

| Component | Proportion (% by weight) |
| --- | --- |
| $SiO_2$ | 20 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0.2 to 25 |
| $TiO_2$ | 2 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CuO, CoO, $Fe_2O_3$, $V_2O_5$, CrO, MnO, $SeO_2$ and mixtures of two or more thereof.

In one embodiment, the cladding glass comprises the following components (in % by weight):

| Component | Proportion (% by weight) |
| --- | --- |
| $SiO_2$ | 20 to 50 |
| $B_2O_3$ | 0 to 5 |
| BaO | 1 to 15 |
| CaO | 0 to 10 |
| SrO | 0 to 2 |
| ZnO | 0 to 5 |
| $Na_2O$ | 2 to 20 |
| $K_2O$ | 1 to 15 |
| $TiO_2$ | 10 to 50 |
| $La_2O_3$ | 0 to 5 |
| $ZrO_2$ | 0 to 5 |
| $Nb_2O_5$ | 1 to 20 |
| $Y_2O_3$ | 0 to 5 |
| CuO and/or NiO | 0.1 to 10 |
| $As_2O_3$ | 0 to 1 |
| $Sb_2O_3$ | 0 to 1 |

In one embodiment, the cladding glass comprises the following components (in % by weight):

| Component | Proportion (% by weight) |
| --- | --- |
| $SiO_2$ | 25 to 40 |
| $B_2O_3$ | 0.1 to 3 |
| BaO | 2 to 10 |
| ZnO | 0 to 2 |
| $Na_2O$ | 5 to 15 |
| $K_2O$ | 2 to 10 |
| $TiO_2$ | 20 to 35 |
| $La_2O_3$ | 0 to 2 |
| $ZrO_2$ | 0 to 2 |
| $Nb_2O_5$ | 2 to 15 |
| $Y_2O_3$ | 0 to 2 |
| CuO and/or NiO | 0.7 to 2 |
| $As_2O_3$ | 0 to 0.5 |
| $Sb_2O_3$ | 0 to 0.5 |

In alternative embodiments the cladding glass comprises the following components (in % by weight):

| Component | Proportion (% by weight) |
| --- | --- |
| $SiO_2$ | >15 to 45 |
| $Al_2O_3$ | 0.1 to 10 |
| PbO | 45 to 75 |
| $B_2O_3$ | 0 to 5 |
| BaO | 0 to 5 |
| CaO | 0 to 5 |
| SrO | 0 to 2 |
| ZnO | 0 to 5 |
| $Na_2O$ | 0 to 10 |
| $K_2O$ | 0 to 5 |
| $TiO_2$ | 0 to 20 |
| $La_2O_3$ | 0 to 5 |
| $ZrO_2$ | 0 to 5 |
| $Nb_2O_5$ | 0 to 5 |
| $Y_2O_3$ | 0 to 5 |
| CuO and/or NiO | 0.1 to 10 |
| $As_2O_3$ | 0 to 1 |
| $Sb_2O_3$ | 0 to 1 |

In alternative embodiments the cladding glass comprises the following components (in % by weight):

| Component | Proportion (% by weight) |
| --- | --- |
| $SiO_2$ | 20 to 40 |
| $Al_2O_3$ | 1 to 5 |
| PbO | 50 to 70 |
| $B_2O_3$ | 0 to 2 |
| BaO | 0 to 2 |
| ZnO | 0 to 2 |
| $Na_2O$ | 0.1 to 3 |
| $K_2O$ | 0 to 2 |
| $TiO_2$ | 0.1 to 10 |
| $La_2O_3$ | 0 to 2 |
| $ZrO_2$ | 0 to 2 |
| $Nb_2O_5$ | 0 to 2 |
| $Y_2O_3$ | 0 to 2 |
| CuO and/or NiO | 0.7 to 2 |
| $As_2O_3$ | 0 to 0.5 |
| $Sb_2O_3$ | 0 to 0.5 |

When in this description is mentioned that the cladding glasses are free of one or more components or that they do not contain one or more components, then this should mean that these components have not been added intentionally to the glass, but that they only may be present as impurities in proportions by weight of at most 500 ppm, further preferably at most 200 ppm, further preferably at most 100 ppm.

The cladding glass should be thick enough for guaranteeing a sufficient absorption of the parasitic laser light. On the other hand, the cladding glass should not be designed considerably thicker than is necessary for a sufficient absorption of the parasitic laser light, since a thicker design normally is connected with additional costs and in addition the dimensions of the laser component are increased in this way which in connection with advancing miniaturization is perceived as a disadvantage. In addition, the absorption of the parasitic light causes within the cladding glass a generation of heat and thus an expansion. This means that the cladding glass has to be cooled effectively for being able to prevent thermo-mechanical problems. Accordingly, the glass thickness has to be relatively low. In principle, however, thicknesses of the cladding in a very large range are conceivable, when it is advantageous for the technical realization. So small laser components, e.g., may be held and fixed with the help of the cladding. The cladding glass has preferably a thickness of 0.05 to 100 mm. Further preferably, the cladding glass has preferably a thickness of 0.5 to 20 mm, still further preferably of 1 to 15 mm, further preferably 1 to 5 mm. Further preferably, the thickness of the cladding glass is even at least 1.5 mm, further preferably at least 2.0 mm. The thickness of the cladding glass is preferably at most 10 mm, further preferably at most 5 mm, further preferably at most 3 mm. It is particularly preferable, when the thickness of the cladding glass is 2.4 to 2.6 mm, especially preferably about 2.5 mm. In alternative embodiments the thickness of the glass is preferably 3 to 10 mm. The thickness of the cladding glass, according to the present disclosure, means its dimension being orthogonal to the surface of the core which is present below the cladding glass and/or parallel to the normal vector of this surface. A low thickness facilitates an easier adjustment of the cladding to the form of the doped sapphire body. So also round laser rods may be cladded.

Figure 6:
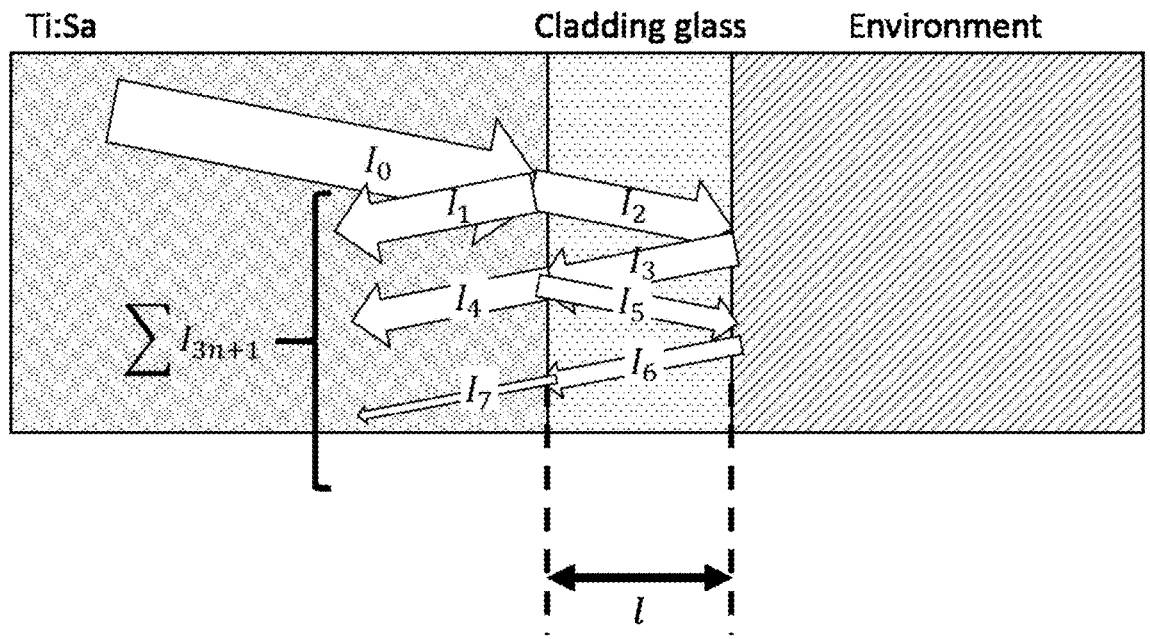
FIG. 6 schematically shows a side view of set-up of Ti:Sa, cladding glass and environment. Parasitic laser light and its way through Ti:Sa and cladding glass are indicated by arrows. The width of the arrows is a representation of its intensity.

A cladding glass should absorb a significant fraction of the parasitic light produced within the Ti:Sa crystals. The most general way of formulating this requirement would consist in saying that a cladded glass having a thickness 1 (expressed in [mm]) and an internal transmission $\tau_{i,1\ [mm]}^{\lambda}$ (for a 1 [mm] glass thickness at a fixed wavelength $\lambda$) as well as a refractive index $n_{\lambda}^{glass}$ (also defined at a fixed wavelength $\lambda$) coupled on one side to an active material for lasing having a refractive index $n_{\lambda}^{LASER}$ and with another surrounding material on the other side (heat sink, air, water, diiodomethane, . . . ) having a refractive index $n_{\lambda}^{env.}$ should absorb a fraction A of the parasitic light incident on the surface of the cladded sapphire. Using these conventions for the material parameter definition we can calculate the amount of light being reflected by the cladding glass. Due to the multiple reflections within the glass we have to consider a sum of contributions which follows a geometric trend. This is schematically shown in FIG. 6. Using the aforementioned conventions we can calculate the individual contributions to the total amount of reflected light:

$I_1 = R_{LASER/Glass} I_0$
$I_2 = (1 - R_{LASER/Glass}) I_0 (\tau_{i,1\ [mm]}^{\lambda})^l$
$I_3 = (1 - R_{LASER/Glass}) I_0 (\tau_{i,1\ [mm]}^{\lambda})^{2l} R_{LASER/Glass}$
$I_4 = (1 - R_{LASER/Glass})^2 I_0 (\tau_{i,1\ [mm]}^{\lambda})^{3l} R_{LASER/Glass}$
$I_5 = R_{LASER/Glass} (1 - R_{LASER/Glass}) I_0 (\tau_{i,1\ [mm]}^{\lambda})^{4l} (R_{Glass/Env})^2$
$I_6 = R_{LASER/Glass} (1 - R_{LASER/Glass}) I_0 (\tau_{i,1\ [mm]}^{\lambda})^{4l} (R_{Glass/Env})^2$
$I_7 = R_{LASER/Glass} (1 - R_{LASER/Glass})^2 I_0 (\tau_{i,1\ [mm]}^{\lambda})^{4l} (R_{Glass/Env})^2$
. . .

The sum of the light fractions being reflected into the Ti:Sa material is given by:

$\Sigma I_{3n+1} = I_1 + I_4 + I_7 + I_{10} + \ldots$

The above expression can be further simplified using the Euclid formula applied to an infinite number of terms for a common ratio smaller than 1 (in the present case $R_{LASER/Glass} R_{Glass/Env} (\tau_{i,1\ [mm]}^{\lambda})^{2l}$ which is perdesign smaller than 1):

$$\sum I_{3n+1} = R_{LASER/Glass} I_0 + (1 - R_{LASER/Glass})^2$$
$$(\tau_{i,1[mm]}^{\lambda})^{2l} R_{Glass/Env} I_0 \left( \frac{1}{1 - R_{LASER/Glass} R_{Glass/Env} (\tau_{i,1[mm]}^{\lambda})^{2l}} \right)$$

In order to minimize the reflection it is most preferred to design the refractive index of the cladding glass so that the Fresnel reflection coefficient $$R_{LASER/Glass} = \frac{(n_{\lambda}^{LASER} - n_{\lambda}^{Glass})^2}{(n_{\lambda}^{LASER} + n_{\lambda}^{Glass})^2}$$

is equal to 0, i.e. $n_{\lambda}^{LASER} = n_{\lambda}^{Glass}$.

Using this assumption, we can simplify further the analytical expression of the relative contribution to the total reflected light:

$$\frac{\sum I_{3n+1}}{I_0} = (\tau_{i,1[mm]}^{\lambda})^{2l} R_{Glass/Env}$$

In the requirements provided above we stated that the glass must fulfill a given amount of absorption $\mathcal{A}$, the properties of the optical system must be designed so that the relative fraction of reflected light fulfill:

$\mathcal{A} = 1 - (\tau_{i,1\ [mm]}^{\lambda})^{2l} R_{Glass/Env}$

The Fresnel coefficient $R_{Glass/Env}$ is given by the relation $$R_{Glass/Env} = \frac{(n_{\lambda}^{Env} - n_{\lambda}^{Glass})^2}{(n_{\lambda}^{Env} + n_{\lambda}^{Glass})^2},$$

we also know from the previous calculation that the refractive index of the glass must be taken equal to the one of Ti:Sa ($n_{\lambda}^{Glass} = n_{\lambda}^{LASER}$. Moreover, we can also calculate the highest potential value of this Fresnel coefficient by assuming that the glass is coupled to air $n_{\lambda}^{Env-air} = 1$. Using these relations we determined a maximum reflection of $R_{Glass/Env} = 0.075$.

In order to fulfill the above relation that binds the absorption to the thickness of the cladding glass we can adjust the internal transmittance $\tau_{i,1\ [mm]}^{\lambda}$. This coefficient depends on the doping via the relation:

$\tau_{i,1\ [mm]}^{\lambda} = \tau_{i0,1\ [mm]}^{\lambda} e^{-\varepsilon_{\lambda} c}$ Where c corresponds to the concentration of the doping element (in mol %) and $\varepsilon_{\lambda}$ is the molar extinction coefficient of the doping element for the optical wavelength $\lambda$ Using these relations we can determine that we need:

$$1 - \mathcal{A} = T = (\tau_{i0,1[mm]}^{\lambda} e^{-\varepsilon_\lambda c})^{2l} R_{Glass/Env}$$

$$\frac{T}{R_{Glass/Env}} = \tau_{i0,1[mm]}^{\lambda \, 2l} e^{-2\varepsilon_\lambda lc}$$

$$\ln\left(\frac{T}{R_{Glass/Env}}\right) = 2l * \ln(\tau_{i0,1[mm]}^{\lambda}) - 2\varepsilon_\lambda lc$$

Usually we are using optical glasses who have an internal transmittance close to 1, i.e. $\tau_{i0,1\,[mm]}^{\lambda}=1$. Because of this the above formula can be further simplified into:

$$c = -\frac{1}{2\varepsilon_\lambda l} \ln\left(\frac{T}{R_{Glass/Env}}\right)$$

This relation is describing all the optical properties that must be satisfied by the glass in order to absorb a fraction $\mathcal{A} = 1-T$ of the incident light. Many different composition may lead to a working cladding glass, to this end one needs a base glass whose refractive index is similar to the refractive index of the active lasing material and a doping having a concentration large enough so that the required absorption can be fulfilled for a given glass thickness. Generally speaking we must lie on the 3D surface defined by $$c \times \varepsilon_\lambda \times l > const. = \max\left(0; -\frac{1}{2}\ln\left(\frac{1-\mathcal{A}}{R_{Glass/Env}}\right)\right)$$

for glass systems having a refractive index similar to the one of Ti:Sa close to λ=800 [nm]. A non-doped glass will produce a total reflection of a fraction $R_{Glass/Env}$ of the light, in other words, for this glass we already know that we are above the limit $A=1-R_{Glass/Env}$, for a total absorption below this limit the above calculation will lead to negative value, because of this we introduced a max function.

For a Ti:Sa without coating or processing on the external surface of the cladding glass there is:

$$c \times \varepsilon_\lambda \times l > -\frac{1}{2}\ln\left(\frac{1-\mathcal{A}}{R_{Glass/Env}}\right) = 2{,}158 \text{ for } \mathcal{A} = 99{,}9[\%];$$

$$c \times \varepsilon_\lambda \times l > -\frac{1}{2}\ln\left(\frac{1-\mathcal{A}}{R_{Glass/Env}}\right) = 1{,}000 \text{ for } \mathcal{A} = 99{,}0[\%];$$

The optical depth x of a material corresponds to the natural logarithm of the ratio of the transmitted light l intensity over the incident light beam intensity received by the glass sample $l_0$.

$$\tau = -\ln\left(\frac{I}{I_0}\right)$$

The optical depth is connected to the attenuation coefficient α(z) via the relation:

$$\tau = \int_0^l \alpha(z).dz$$

Where l corresponds to the total thickness of the sample and z is the position thought the material considered z∈[0;l]. This formulation is a very general one, in the case of optical glass we are dealing with an isotropic material, which means that the properties of this material are independent of the position within this material, i.e. α(z)=cst. and τ=α.l. The attenuation coefficient is defined:

$$\alpha = \sum_i \varepsilon_i c_i$$

Where $\varepsilon_i$ is the molar attenuation coefficient and $c_i$ is the molar concentration within the glass.

In other words, in the case of an optical glass the optical depth is equal to the product c×ε×l.

The optical depth is connected to the absorbance A via the relation: ln(10)×A=ε

In view of the above, we conclude that glasses dedicated to cladding applications which are having an optical depth of at least 2,16 are advantageous in order to achieve a suppression of at least 99.9% of the parasitic light. For an absorption of at least 99% of the light it is advantageous to use a glass having an optical depth of at least 1.

Preferably, the laser component of the disclosure comprises exactly one cladding glass.

In certain embodiments, the cladding glass may comprise a coating. Preferably, the coating is present on the surface of the cladding glass not facing the core. In this case, typically, the surface of the cladding glass is polished and thus smooth. Preferably, in such embodiments, the root mean square (RMS) average of the surface roughness of the cladding glass is in a range of 0.05 nm to 20 nm, further preferably of 0.1 nm to 10 nm, further preferably of 0.3 nm to 5 nm, further preferably of 0.5 nm to 3 nm, further preferably of 1 nm to 2 nm. The roughness in the nanometer range and subnanometer range is preferably measured in an optical manner, particularly preferably via a white light interferometer or via atomic force microscopy (AFM).

A preferable coating on the surface of the cladding glass not facing the core is a layered antireflection system. Such a layered system, typically, consists of a dielectric layer with low refractive index or a series of dielectric layers with different refractive indices.

In an alternative, the surface not facing the core can also be made matted by roughening for preventing directional reflections. In this case the outer side is preferably characterized by a root mean square (RMS) average of the surface roughness in a range of 0.1 μm to 100 μm, further preferably of 0.5 μm to 50 μm, particularly preferably of 1 μm to 10 μm. The roughness in the range of micrometers is preferably measured in a tactile manner or particularly preferably via a white light interferometer. Preferably, the matting is located on the surface of the cladding glass not facing the core. An absorbing coating may also be applied onto the matted surface.

A further coating which may be provided in an alternative to or in addition to the mentioned antireflection measures is a protective layer serving as a protection of the cladding glass against corrosion. Normally, due to the heat development generated by the absorption of the parasitic laser light, it is necessary to cool the cladding glass. For this purpose it is reasonable to bring the cladding glass in contact with a cooling agent. Preferably, the cooling agent is a cooling liquid. It is possible that the cooling liquid attacks the cladding glass and results in corrosion so that ions may be leached out of the glass. This is in particular the case, when boron-containing glasses are used, because they have a comparatively low chemical stability against aqueous corrosion. Accordingly, it is preferred that on the surface of the cladding glass not facing the core, but facing the cooling agent a protective layer protecting against corrosion is applied. Such layers may e.g. be organic lacquers.

In a further preferable embodiment in an alternative to or in addition to the above-mentioned coatings a sealing layer is provided which seals up the boundary surface of cladding glass and core from outside. The advantage thereof is that the penetration of air or cooling agent is prevented which might result in detachment of the cladding glass from the core. For efficiently preventing the penetration of air or cooling agent at the boundary surface of cladding glass and core the sealing layer should be applied such that is covers the corresponding boundary surface from outside in as complete as possible manner. Preferably, the sealing layer comprises at least one resin.

According to the present disclosure, protective layers can be applied e.g. by a CVD process (chemical vapor deposition), such as e.g. by atomic layer deposition (ALD). They can ideally conform to the form and the surface roughness. Preferably, for such barrier layers e.g. $SiO_2$, $Al_2O_3$, $TiO_2$ or mixtures of these materials are used. Coatings which are applied outside can also show several advantageous properties. So e.g. a coating can be chosen which on the one hand absorbs residual light of the laser and on the other hand also protects the cladding glass. In an alternative, different coatings can be combined, by e.g. still applying a protective layer onto a completely absorbing layer.

Preferably, the laser component according to the present disclosure comprises a cladding glass comprising a coating and/or being roughened on at least one side area.

According to the present disclosure is also a method for producing a laser component according to at least one of the preceding claims, comprising the following steps
 a) providing of the doped sapphire,
 b) providing of the cladding glass, and
 c) arranging of the cladding glass on the doped sapphire.

The provision of the cladding glass according to step b) of the method preferably comprises the steps of
 b1) providing a suitable glass composition,
 b2) melting the provided composition, and
 b3) cooling the melt to a glass.

The step of cooling the melt according to step b3) of the method may be conducted with different cooling rates. Preferably, the mean cooling rate in the case of cooling from a temperature T1 which is at least above the glass transition temperature $T_G$ of the glass to a temperature T2 which is about 20° C. is in a range of 0.1 K per hour to 50 K per hour, further preferably 0.5 K per hour to 40 K per hour, further preferably in a range of 1 K per hour to 30 K per hour, still further preferably 2 K per hour to 7 K per hour, still further preferably about 5 K per hour. In an alternative preferred embodiment, in contrast, the mean cooling rate in the case of cooling from a temperature T1 which is at least above the glass transition temperature $T_G$ of the glass to a temperature T2 which is about 20° C. is at most 15 K per hour, further preferably at most 10 K per hour, further preferably at most 5 K per hour. In this way the refractive index of the glass can be increased so that glass compositions with a reduced content of highly-refractive components, in particularly with a reduced content of $Y_2O_3$, can be used. In particular embodiments the cooling rate in the case of cooling from a temperature T1 which is at least above the glass transition temperature $T_G$ of the glass to a temperature T2 which is about 20° C. is substantially constant. "Substantially constant" means that the difference between the maximum cooling rate and the minimum cooling rate is at most 10 K per hour, further preferably at most 7 K per hour, further preferably at most 5 K per hour, still further preferably at most 3 K per hour.

In addition, by means of the cooling rate the optical properties of the cladding glass can be adjusted to the refractive index of the doped sapphire crystal which on its part depends on the one hand on the respective batch and on the other hand on the site within the doped sapphire crystal. The reason for that is that the dopant ions, in particularly the Ti ions, are not homogenously distributed in the sapphire crystal, in particularly in the case of crystals which have been produced by the Czochralski process or the Bridgman-Stockbarger method. These heterogeneities result from macro-segregation phenomena. Accordingly, these local variations of the concentration of Ti in the Ti:Sa monocrystal result in local variations of the refractive Ti:Sa indices. The values of the Ti:Sa lasing crystal then depend on the position of the point of intersection in the Ti:Sa monocrystal. Therefore, it is necessary that the already produced cladding glasses also take account of such variations of the refractive index. This can be achieved by an adjusted cooling method.

Thus, the refractive index of the Ti:Sa crystal is not only characterized by fluctuations between different batches, but also within one crystal. For a manufacturer of glass, it is hardly possible to adjust the refractive index of the cladding glass, respectively via a change of the glass composition, to the variable refractive index of the Ti:Sa crystal, since this would be connected with an immense effort. Therefore, it is advantageous that it is possible to adjust the refractive index of the glasses of the disclosure in a flexible manner via the cooling rate.

A low cooling rate is advantageous, so glasses with less inner tensions are obtained. Such glasses have high homogeneity so that less double refraction occurs. In addition, such glasses can be processed excellently.

Preferably, the method comprises the further step b4) of polishing the cladding glass so that preferably a polished cladding glass is provided.

Preferably, the cladding glass of the present disclosure is characterized by a low root mean square (RMS) average of surface roughness. Preferably, the surface roughness (RMS) is in a range of 0.05 nm to 20 nm, further preferably of 0.1 nm to 10 nm, further preferably of 0.3 nm to 5 nm, further preferably of 0.5 nm to 3 nm, further preferably of 1 nm to 2 nm. This in particularly is important for the surface of the cladding glass facing the core. So a particularly good adhesion between the cladding glass and the core is achieved. In addition, a low roughness is also advantageous for the reason that the diffusion of heat can be improved with it and therefore heat which for example is generated by the absorption of the parasitic laser light can be dissipated from the glass in a better manner. On the surface of the cladding glass not facing the core a low surface roughness may be advantageous for the application of a coating, such as described above. The roughness in the nanometer range and subnanometer range is preferably measured in an optical manner, particularly preferably via a white light interferometer.

The method may optionally comprise the further step b5) of applying a coating onto the cladding glass. Preferably, the coating is applied by means of physical vapor deposition (PVD). This is in particularly important for outer coatings which on the one side are in contact with the cladding glass and on the other side are in contact with the environment, in particularly with air.

The cladding glass of the present disclosure is not restricted with respect to certain geometries. Also the crosssection of the doped sapphire crystal may not necessarily have a square or rectangular form, it may rather also have a circular (also with flat portions) or polygonal form.

According to the present disclosure is also a glass having a refractive index of at least 1.70 and comprising the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof, wherein the glass absorbs at least 90.0%, preferably at least 99.0%, more preferably at least 99.9% of light having a wavelength of 800 nm, and wherein a thickness of the glass is at most 100 mm, more preferably at most 20 mm.

According to the present disclosure is also a glass having a refractive index of at least 1.70 and comprising the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof and wherein the equation $$c \times \varepsilon_\lambda \times l > -\frac{1}{2}\ln\left(\frac{1-\mathcal{A}}{R_{Glass/Env}}\right)$$

is fulfilled, wherein c is the proportion of the absorption component in the glass in mol %, $\varepsilon_\lambda$ is the molar extinction coefficient of the absorption component for light of the wavelength $\lambda$ in $(mm \cdot mol\%)^{-1}$, l is the glass thickness in mm, $R_{Glass/Env}$ is the Fresnel coefficient given by the relation $$R_{Glass/Env} = \frac{(n_\lambda^{Env} - n_\lambda^{Glass})^2}{(n_\lambda^{Env} + n_\lambda^{Glass})^2}$$

with $n_\lambda^{Glass}$ being the refractive index of the glass for light of the wavelength $\lambda$ and $n_\lambda^{Env}$ being the refractive index of the environment for light of the wavelength $\lambda$, and A is the fraction of light of the wavelength $\lambda$ absorbed by the glass, wherein A is at least 0.95.

In one embodiment, the glasses of the disclosure comprise the following components (in % by weight):

| Component | Proportion (% by weight) |
|---|---|
| $SiO_2$ | 10 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0.1 to 25 |
| $TiO_2$ | 1 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CoO, $Fe_2O_3$, $V_2O_5$, CrO, MnO, $SeO_2$ and mixtures of two or more thereof.

In one embodiment, the glasses of the disclosure comprise the following components (in % by weight):

| Component | Proportion (% by weight) |
|---|---|
| $SiO_2$ | 20 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0.2 to 25 |
| $TiO_2$ | 2 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CuO, CoO, $Fe_2O_3$, $V_2O_5$, CrO, MnO, $SeO_2$ and mixtures of two or more thereof.

According to the present disclosure is also a cladding glass of a solid-state laser having a refractive index of at least 1.70 and comprising the following components (in % by weight):

| Component | Proportion (% by weight) |
|---|---|
| $SiO_2$ | 1 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0 to 25 |
| $TiO_2$ | 0 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | or

| Component | Proportion (% by weight) |
|---|---|
| $SiO_2$ | 10 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SO | 0 to 2 |
| ZnO | 0 to 30 |
| $Li_2O + Na_2O + K_2O$ | 0.1 to 25 |
| $TiO_2$ | 1 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | or

| Component | Proportion (% by weight) |
|---|---|
| $SiO_2$ | 20 to 40 |
| $Al_2O_3$ | 0 to 10 |
| PbO | 0 to 70 |
| $B_2O_3$ | 0 to 45 |
| BaO | 0 to 10 |
| CaO | 0 to 10 |
| SrO | 0 to 2 |
| ZnO | 0 to 30 |
| $Li_2O + Na_2O + K_2O$ | 0.2 to 25 |
| $TiO_2$ | 2 to 40 |
| $La_2O_3$ | 0 to 60 |
| $ZrO_2$ | 0 to 15 |
| $Nb_2O_5$ | 0 to 15 |
| $Y_2O_3$ | 0 to 15 |
| Absorption component | 0.1 to 10 |
| $As_2O_3$ | 0 to 1 |
| $Sb_2O_3$ | 0 to 1 |
| $PbO + BaO + TiO_2 + La_2O_3 + Nb_2O_5$ | 40 to 70 | wherein the absorption component is selected from the group consisting of NiO, CuO, CoO, $Fe_2O_3$, $V_2O_5$, CrO, MnO, $SeO_2$ and mixtures of two or more thereof and wherein the glass has an optical depth t of at least 1 in the direction of the parasitic laser light.

Preferably, the glass is in a cooling state which corresponds to a steady cooling from a temperature T1 to a temperature T2 with a mean cooling rate in a range of 0.5 K per hour to 40 K per hour, wherein the temperature T1 is at least above the glass transition temperature Tg and the temperature T2 is 20° C. Here, "steady" means a process of continuous cooling from T1 to T2 without maintaining the glass at certain temperature levels. In particular, with that a process of cooling with substantially constant cooling rate is meant.

In alternative embodiments the cladding glass comprises the following components (in % by weight):

| Component | Proportion (% by weight) |
|---|---|
| $SiO_2$ | 20 to 50 |
| $B_2O_3$ | 0 to 5 |
| BaO | 1 to 15 |
| CaO | 0 to 10 |
| SrO | 0 to 2 |
| ZnO | 0 to 5 |
| $Na_2O$ | 2 to 20 |
| $K_2O$ | 1 to 15 |
| $TiO_2$ | 10 to 50 |
| $La_2O_3$ | 0 to 5 |
| $ZrO_2$ | 0 to 5 |
| $Nb_2O_5$ | 1 to 20 |
| $Y_2O_3$ | 0 to 5 |
| CuO and/or NiO | 0.1 to 10 |
| $As_2O_3$ | 0 to 1 |
| $Sb_2O_3$ | 0 to 1 |

In alternative embodiments the cladding glass comprises the following components (in % by weight):

| Component | Proportion (% by weight) |
|---|---|
| $SiO_2$ | 25 to 40 |
| $B_2O_3$ | 0.1 to 3 |
| BaO | 2 to 10 |
| ZnO | 0 to 2 |
| $Na_2O$ | 5 to 15 |
| $K_2O$ | 2 to 10 |
| $TiO_2$ | 20 to 35 |
| $La_2O_3$ | 0 to 2 |
| $ZrO_2$ | 0 to 2 |
| $Nb_2O_5$ | 2 to 15 |
| $Y_2O_3$ | 0 to 2 |
| CuO and/or NiO | 0.7 to 2 |
| $As_2O_3$ | 0 to 0.5 |
| $Sb_2O_3$ | 0 to 0.5 |

In other alternative embodiments the cladding glass comprises the following components (in % by weight):

| Component | Proportion (% by weight) |
|---|---|
| $SiO_2$ | >15 to 45 |
| $Al_2O_3$ | 0.1 to 10 |
| PbO | 45 to 75 |
| $B_2O_3$ | 0 to 5 |
| BaO | 0 to 5 |
| CaO | 0 to 5 |
| SrO | 0 to 2 |
| ZnO | 0 to 5 |
| $Na_2O$ | 0 to 10 |
| $K_2O$ | 0 to 5 |
| $TiO_2$ | 0 to 20 |
| $La_2O_3$ | 0 to 5 |
| $ZrO_2$ | 0 to 5 |
| $Nb_2O_5$ | 0 to 5 |
| $Y_2O_3$ | 0 to 5 |
| CuO and/or NiO | 0.1 to 10 |
| $As_2O_3$ | 0 to 1 |
| $Sb_2O_3$ | 0 to 1 |

In other alternative embodiments the cladding glass comprises the following components (in % by weight):

| Component | Proportion (% by weight) |
|---|---|
| $SiO_2$ | 20 to 40 |
| $Al_2O_3$ | 1 to 5 |
| PbO | 50 to 70 |
| $B_2O_3$ | 0 to 2 |
| BaO | 0 to 2 |
| ZnO | 0 to 2 |
| $Na_2O$ | 0.1 to 3 |
| $K_2O$ | 0 to 2 |
| $TiO_2$ | 0.1 to 10 |
| $La_2O_3$ | 0 to 2 |
| $ZrO_2$ | 0 to 2 |
| $Nb_2O_5$ | 0 to 2 |
| $Y_2O_3$ | 0 to 2 |
| CuO and/or NiO | 0.7 to 2 |
| $As_2O_3$ | 0 to 0.5 |
| $Sb_2O_3$ | 0 to 0.5 |

Preferably, the refractive index of the glass is in a range of 1.70 to 1.80, further preferably 1.72 to 1.78, further preferably 1.73 to 1.77, further preferably 1.74 to 1.77, further preferably 1.750 to 1.765, further preferably 1.750 to 1.760.

Preferably, the Abbe number of the glass is at least 35, further preferably at least 40, further preferably at least 45, further preferably at least 47, further preferably at least 48. Preferably, the Abbe number of the glass is not higher than 55, further preferably not higher than 52.

Preferably, the mean coefficient of linear longitudinal thermal expansion <α> of the glass in a temperature range of −30° C. to 70° C. is in a range of $4.5*10^{-6} K^{-1}$ to $7.0*10^{-6} K^{-1}$, further preferably $5.0*10^{-6} K^{-1}$ to $6.5*10^{-6} K^{-1}$, further preferably $5.2*10^{-6} K^{-1}$ to $6.4*10^{-6} K^{-1}$, further preferably $5.5*10^{-6} K^{-1}$ to $6.0*10^{-6} K^{-1}$, further preferably $5.7*10^{-6} K^{-1}$ to $5.9*10^{-6} K^{-1}$.

Figure 3:
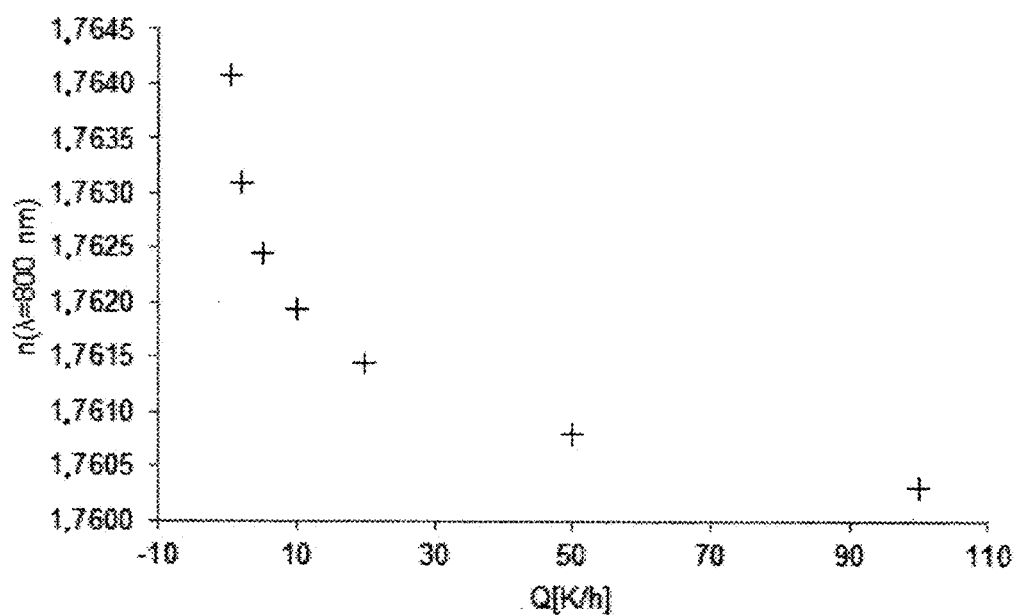
FIG. 3 shows the dependency of the refractive index on the cooling rate.

The cooling state of a glass can also be determined on a given glass without any knowledge about the production conditions. When a glass sample P is available, then at first its refractive index $n_\lambda$ (for a given wavelength λ) and/or its mass density ρ are determined. Then, preferably, the sample is separated into several individual samples P1, P2, P3 etc. Each sample is heated to the temperature T1, wherein T1 is at least above the glass transition temperature Tg, and then it is cooled to the temperature T2 with different cooling rates Q1, Q2, Q3 etc. After cooling to the temperature T2 and, preferably, further cooling to room temperature, again the refractive index $n_\lambda$, and/or the mass density p are determined so that to anyone of the values a cooling rate can be assigned. Then, the pairs of values obtained can be plotted into a logarithmic coordinate system with the help of a linear interpolation, wherein the ordinate is used for the density values and the abscissa is used for the logarithmic values of the cooling rate. Now, on the basis of the cooling curve such obtained conclusions can be drawn from the density of the glass sample P about its cooling state. The following is true: $n_\lambda(Q) = n_\lambda(Q_i) + m_{n\lambda} \cdot \log(Q/Q_i)$, wherein $m_{n\lambda}$ and $n_\lambda(Q_i)$ are the regression parameters which are determined by means of the experimental analyses. The value $n_\lambda(Q_i)$ is the value of the refractive index measured at the wavelength λ of a glass being cooled with the cooling rate Qi. The dependency of the refractive index on the cooling rate is shown in FIG. 3. In the example section an experimental example is shown.

With the help of this cooling rate/refractive index-dependency the cladding glass can optimally be adjusted to the doped sapphire material by secondary cooling so that the reflection at the surface doped sapphire/cladding glass can be minimized.

Thus, the cooling state of a glass is a measure for the conditions during the process of cooling of the glass. A conventionally "quenched" glass which has been cooled very quickly after melting (e.g. >>300 K/h) has a high cooling state. The atoms in such a glass are "frozen" in a comparatively disordered state. Thus, by quick cooling of the melt the glass will quasi be "frozen" at a high energy level. The ranges of high temperature in which a spatial approach of the crystal components due to low viscosity was still possible have quickly been passed through. So a quickly cooled glass having a high cooling state has a comparatively low density or refractive index. The differences of the refractive index of a glass dependently on its cooling state are comparatively low. But since these properties can reliably be measured up to the sixth decimal place, nevertheless, this method is suitable for providing a reliable measuring result.

The arranging of the cladding glass on the active laser material should be conducted such that at the boundary surface no disturbing reflections of the parasitic laser light occur, before it is advantageously absorbed in the cladding glass and thus annihilated. When there are adhesives having refractive indices in the range of the refractive index of both components, wherein the refractive indices thereof can exactly be adjusted (e.g. by mixing of at least two adhesives with different refractive indices in the correct ratio), then thus also parasitic oscillations can be suppressed by a cladding which is affixed by adhesive bonding. But in the case of laser materials with a very high amplification (gain) the reflectivity of the boundary surfaces has to be very low and thus the adjustment of the refractive index has to be very exact. For laser glasses affixing the cladding glass by adhesive bonding is possible. Mostly, the refractive indices are between 1.5 and 1.55 and the amplification of parasitic reflected light is not too strong.

In the case of titanium/sapphire lasers gluing together is more difficult. The amplification is so strong that the reflectivity of the boundary surface has to be very low and thus the adjustment of the refractive index has to be very exact, while the refractive index is relatively high. In principle, cladding of the titanium/sapphire crystal via affixing the cladding glass by adhesive bonding is possible, but organic adherences, besides the mentioned difficulties, are also connected with further disadvantages, such as e.g. a low temperature resistance and chemical change over time.

A preferable solution which is proposed according to the present disclosure uses the so-called optical contact bonding as the bonding technology. Thus, preferably, the arranging of the cladding glass on the doped sapphire is realized by optical contact bonding. When two conformable surfaces (in the simplest case two plane faces) approach up to ca. 1 nm or less, then intermolecular bonds are formed (e.g. covalent bonds). Often a start in a small area of a larger surface is enough. Then, in adjacent areas this brings both surfaces nearer and nearer and the process of optical contact bonding spreads over larger areas of the surfaces. For that it is advantageous, when the bodies which have to be bonded by optical contact bonding are characterized by a certain minimal elasticity, but, nevertheless, a good accuracy in shape is necessary. Such an optical contact bonding can be conducted with different materials, such as e.g. metals, semiconductor metals, glasses, crystals. Here, also different materials can together be used for optical contact bonding, such as e.g. different glasses or a glass and a crystal. When such a bonding process has proceeded, then both bodies cannot be separated from each other without at least partial damaging or even destruction. For optical components the process of optical contact bonding has been used as a bonding process for a long time, e.g. for plane faces, e.g. in the case of prisms and beam splitters, and also e.g. for curved faces, e.g. in the case of lens systems. Here, the surfaces have to be both, they have to fit perfectly and they also have to be free of contamination (e.g. of fat or dust). While layers of contamination, such as e.g. fat, prevent the formation of intermolecular bonds between both bodies, dust and other particles result in entrapped air which reflects light at the surface.

When at least one of both bodies is sufficiently elastic, then of course the accuracy of fit of the areas to be bonded has not to be 1 nm. Dependently on other parameters such as thickness and elasticity it is advantageous, when the form deviation between the doped sapphire crystal and the cladding glass is less than 1000 nm, wherein particularly advantageous are less than 200 nm and especially advantageous are less than 50 nm. A preferable measure for the form deviation is the distance "peak-to-valley" between both surfaces.

Glass is capable of withstanding enormous compressive tensions and mostly cracks under tensile stress, wherein microcracks extend through the glass and result in rupturing of the glass. When it is intended to stabilize glass or glass composites, then it is advantageous to increase the compressive surface tensions, because first they have to be overcome by a crack. Exactly this fact is the background of thermal or chemical tempering technologies. Accordingly, it is further also advantageous, when the deviation of both areas which have to be bonded by optical contact bonding are concave in form, i.e. when the areas, theoretically, in the center have a low distance, when the rims are in contact with each other and both bodies cannot be deformed in an elastic manner. When then the areas have come nearer and nearer through the propagating process of optical contact bonding, then both rims are under compressive tensions and the composite is characterized by higher durability. Of course, the site, where the boundary surface of both materials adjoins to the surface at the side, remains a sensible breaking point. The durability of the composite can be increased further, when this site is sealed on the surface e.g. with a lacquer or an adhesive.

The solution according to the present disclosure of the absorption of the parasitic laser light via a cladding glass according to the present disclosure in comparison to the use of an absorbing liquid known from prior art has a lot of advantages. The known liquids underlie an ageing process and therefore they have to be exchanged regularly. Furthermore, the absorption of the liquid has to be adjusted by the addition of a staining solution. This is a complicated undertaking, because the refractive index has to be calibrated very exactly. In addition, the used liquids are toxic so that the handling thereof additionally becomes still more difficult. A particularly large disadvantage of the use of an absorbing liquid for the absorption of the parasitic laser light is that the dispersion of the known liquids strongly differs from the dispersion of the sapphire so that the adjustment of the refractive index of the liquid to the refractive index of the sapphire only in a very small wavelength range can lead to satisfactory results.

Figure 4:
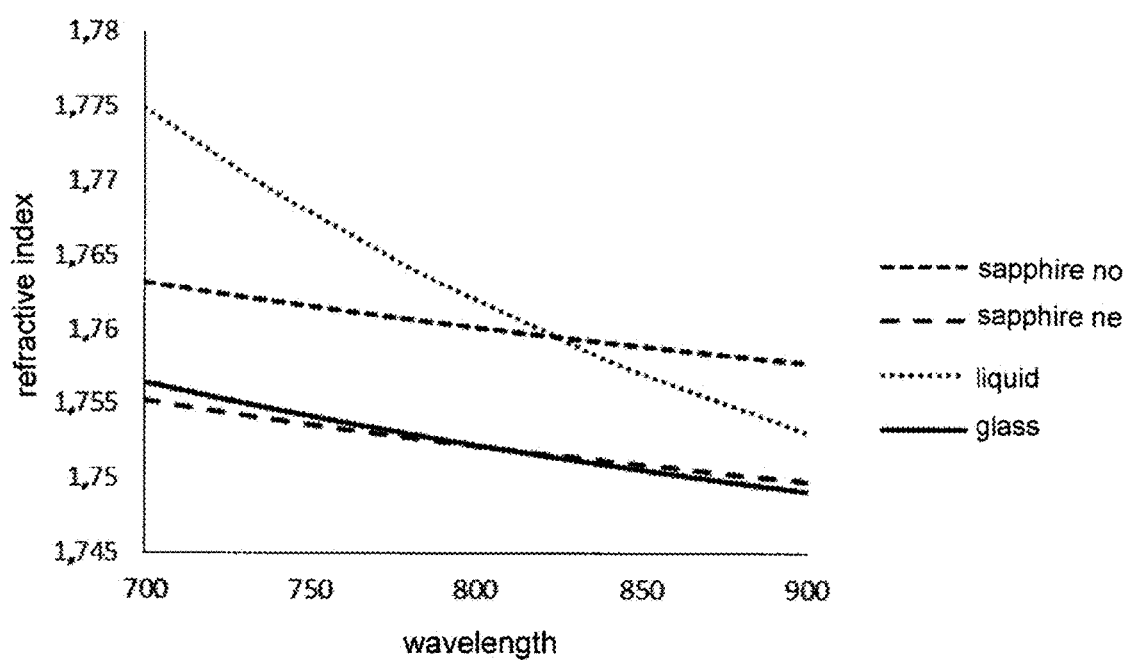
FIG. 4 shows the dependency of the refractive index on the wavelength.

The advantages of the glass according to the present disclosure in comparison to an absorbing liquid with respect to the adjustment of the refractive index to the refractive index of the sapphire over a relatively large wavelength range can also be learned from the presentation in FIG. 4. Such an adjustment over a large wavelength range is particularly advantageous, since also the parasitic laser light normally is characterized by wavelengths in a large range. This is in particularly the case, when lasers characterized by short pulses such as for example femtosecond lasers are used, for which according to the uncertainty relation due to the shortness of the pulse a broad wavelength range results.

EXAMPLES

Example Glasses

Example glasses 1 to 6 are shown in the following table. The amount of the components is indicated in % by weight. Example glasses 1 to 6 show that the disclosure can be put into praxis with various absorption components and with various amounts thereof.

Mike the following table looks off.

| Component | Ex. 1 | Ex. 2 | Ex. 3 | Ex. 4 | Ex. 5 | Ex. 6 |
|---|---|---|---|---|---|---|
| $SiO_2$ | 6 | 6 | 5 | 6 | 6 | 5 |
| $B_2O_3$ | 30 | 30 | 28 | 30 | 30 | 28 |
| BaO | 0.3 | 0.3 | 0.3 | 0.3 | 0.3 | 0.3 |
| ZnO | 3 | 3 | 3 | 3 | 3 | 3 |
| $La_2O_3$ | 49 | 49 | 46.5 | 49 | 50 | 46.6 |
| $ZrO_2$ | 8 | 8 | 8 | 8 | 8 | 8 |
| $Nb_2O_5$ | 0.6 | 0.6 | 0.6 | 0.6 | 0.6 | 0.6 |
| $Y_2O_3$ | 2 | 2 | 8.25 | 2 | 2 | 8.3 |
| CuO | | | | | 0.25 | 0.1 |
| CoO | | | | 1 | | |
| NiO | | 1 | 0.25 | | | |
| $V_2O_5$ | 1 | | | | | |
| $As_2O_3$ | 0.2 | 0.2 | 0.02 | 0.2 | | |
| $Sb_2O_3$ | | | 0.02 | | | |
| Internal transmission at 800 nm for a sample with a thickness of 1 mm | 0.85 | 0.41 | 0.80 | 0.79 | 0.45 | 0.71 |
| Refractive index at 800 nm | 1.7511 | 1.7503 | 1.7596 | 1.7491 | 1.7481 | 1.7586 |

| Component | Ex. 1 | Ex. 2 | Ex. 3 | Ex. 4 | Ex. 5 | Ex. 6 |
|---|---|---|---|---|---|---|
| Abbe number | 47.53 | 49.69 | 49.45 | 47.79 | 48.72 | 49.42 |
| $\partial n(\lambda)/\partial \lambda$ [µm$^{-1}$] for $\lambda$ = 800 [nm] | −0.03537 | −0.03463 | −0.03546 | −0.03492 | −0.03515 | −0.03541 |
| $\varepsilon_{\lambda=800\,nm}$ [mm$^{-1}$ * mol %$^{-1}$] | 0.227 | 0.511 | 0.442 | 0.138 | 1.948 | 1.912 |
| I [mm] for A = 99.9% | 13.00 | 2.38 | 9.91 | 9.35 | 2.66 | 6.37 |
| I [mm] for A = 99.0% | 6.06 | 1.10 | 4.64 | 4.35 | 1.24 | 2.98 |

The following table shows further example glasses 7 and 8 as well as corresponding comparative examples A and B. The amount of the components is indicated in % by weight. The results show that the disclosure can be put into praxis with various base glass compositions.

| Component | Ex. 7 | Ex. 8 | Comp. Ex. A | Comp. Ex. B | Comp. Ex. C |
|---|---|---|---|---|---|
| $SiO_2$ | 34 | 29.5 | 34 | 29.5 | 5 |
| $Al_2O_3$ | | 2.75 | | 2.75 | |
| PbO | | 63 | | 63.25 | |
| $B_2O_3$ | 0.5 | | 0.5 | | 28 |
| BaO | 7 | | 7 | | 0.3 |
| CaO | 1 | | 1 | | |
| ZnO | | | | | 3 |
| $Na_2O$ | 12 | 0.5 | 12.25 | 0.5 | |
| $K_2O$ | 6.25 | | 6.25 | | |
| $TiO_2$ | 29 | 3.7 | 29 | 3.7 | |
| $La_2O_3$ | | | | | 47 |
| $ZrO_2$ | | | | | 7.7 |
| $Nb_2O_5$ | 10 | | 10 | | 0.6 |
| $Y_2O_3$ | | | | | 8 |
| CuO | 0.25 | 0.25 | | | |
| CoO | | | | | |
| NiO | | | | | |
| $V_2O_5$ | | | | | |
| $As_2O_3$ | | 0.3 | | 0.3 | 0.2 |
| $Sb_2O_3$ | 0.2 | | | | |
| Internal transmission at 800 nm for a sample with a thickness of 1 mm | 0.64 | 0.55 | 1.00 | | 0.99 |
| Refractive index at 800 nm | 1.7376 | 1.7708 | 1.7400 | | 1.7609 |
| Abbe number | 26.65 | 27.13 | 26.46 | | 49.39 |
| $\partial n(\lambda)/\partial \lambda$ [µm$^{-1}$] for $\lambda$ = 800 [nm] | −0.05706 | −0.05836 | −0.05383 | | −0.03559 |
| $\varepsilon_{\lambda=800\,nm}$ [mm$^{-1}$ * mol %$^{-1}$] | 1.767 | 1.627 | | | |
| I [mm] for A = 99.9% | 4.84 | 3.61 | | | |
| I [mm] for A = 99.0% | 2.24 | 1.70 | | | |

Optical Properties

For comparison, the extraordinary refractive index as well as the value $<\alpha_{sapphire}>_{//c}$ and the value $<\alpha_{sapphire}>_{\perp c}$ were determined for a Ti-doped sapphire crystal (Ti:Sa). The extraordinary refractive index was 1.75. In a temperature range of 20° C. to 50° C. the value $<\alpha_{sapphire}>_{//c}$ was $5.0*10^{-6}$ K$^{-1}$ and the value $<\alpha_{sapphire}>_{\perp c}$ was $6.6*10^{-6}$ K$^{-1}$ so that the mean value $<\alpha_{sapphire}>$ is $5.8*10^{-6}$ K$^{-1}$.

All the example glasses 1 to 8 have a comparably low internal transmission at a wavelength of 800 nm. In addition, the differences between the refractive index of the example glasses and the extraordinary refractive index of the Ti-doped sapphire crystal are very low. Thus, the example glasses 1 to 8 are excellently suitable as cladding glasses for the Ti-doped sapphire crystal.

The refractive indices and the Abbe numbers of the comparative glasses are similar to that of the example glasses. But the comparative glasses have a high internal transmission at a wavelength of 800 nm, and therefore these comparative glasses should not be used as cladding glasses for reducing parasitic laser light.

Influence of the Cooling Rate onto the Refractive Index

Two samples having a composition according to comparative example C were cooled with different cooling rates and the refractive indices of the samples were examined for determining the influence of the cooling rate onto the refractive index. On the basis of the cooling curve conclusions can be drawn from the density of the glass sample about its cooling state. The following is true: $n_\lambda(Q)=n_\lambda(Q_i)+m_{n\lambda}\cdot\log(Q/Q_i)$, wherein $m_{n\lambda}$ and $n_\lambda(Q_i)$ are the regression parameters which are determined by means of the experimental analyses. In this case for the regression we have selected Qi=5 [K/h] as a reference value.

The data are shown in the following table.

| Comparative example C | | |
|---|---|---|
| Q [K/h]: | 40 | 5 |
| log(Q) | 1.60205999 | 0.69897 |
| $n_d$ | 1.77212 | 1.77360 |
| $n_e$ | 1.77585 | 1.77733 |
| $n_g$ | 1.79168 | 1.79316 |
| $n_{F'}$ | 1.78395 | 1.78543 |
| $n_F$ | 1.78305 | 1.78453 |
| $n_e$ | 1.77585 | 1.77733 |
| $n_d$ | 1.77212 | 1.77360 |
| $n_C$ | 1.76814 | 1.76962 |
| $n_C$ | 1.76740 | 1.76887 |
| $n_r$ | 1.76473 | 1.76621 |
| n(λ): | 1.76096 | 1.762437 |
| λ[nm]: | 800 | 800 |
| $n_0$ | 1.74165894 | 1.7432831 |
| A | 1.16E-02 | 1.15E-02 |
| $\lambda_0$ | 1.60E-01 | 1.58E-01 |
| C | 1.13E+00 | 1.14E+00 |

$m_{\lambda=800[nm]}$: −0.00163997
$n_{\lambda=800[nm]}$: 1.762437

The experimental values of the refractive indices on their part are dependent on the cooling rate. For the comparative example C the cooling coefficients for the refractive index n(λ=800 [nm]) have been adjusted with the help of the optical values for 40 [K/h] and 5 [K/h]. The values of the refractive index n(λ) for λ=800 [nm] have been calculated with the help of the Hartmann equation, $n(\lambda)=n_0+A/(\lambda-\lambda_0)^C$. The coefficients $n_0$, A, $\lambda_0$, C of this equation are based on the experimental values $n_d$, $n_e$, $n_g$, $n_{F'}$, $n_e$, $n_C$, $n_C$, $n_r$, which have been calculated for Q=40 [K/h] and Q=5 [K/h]. It can be seen that with a lower cooling rate a higher refractive index can be achieved.

The dependency of the refractive index on the cooling rate is shown in FIG. 3 for comparative example C.

Dependency of the Refractive Index on the Wavelength

In FIG. 4 the dependency of the refractive index on the wavelength is shown for a glass according to the present disclosure, for a liquid (Cargille Refractive Index Matching Liquid, Series M) as well as for the ordinary (ne) and the extraordinary (no) refractive indices of the sapphire for a wavelength range of 700 nm to 900 nm.

It can be seen that the glass according to the present disclosure is excellently adjusted to the extraordinary refractive index of the sapphire over the whole wavelength range. In contrast thereto, the differences between the refractive index of the liquid and the refractive index of the sapphire are considerably higher in the uppermost and lowermost ranges of the shown wavelength range. It can be seen that the dependency of the refractive index on the wavelength is much higher in the case of the liquid than in the case of the glass according to the present disclosure or in the case of the sapphire. Therefore, over a broad wavelength range the adjustment of the refractive index to the refractive index of the sapphire is possible in a much higher extent in the case of the glass according to the present disclosure than in the case of the liquid.

Impact of Different Absorption Components on the Refractive Index

Figure 5:
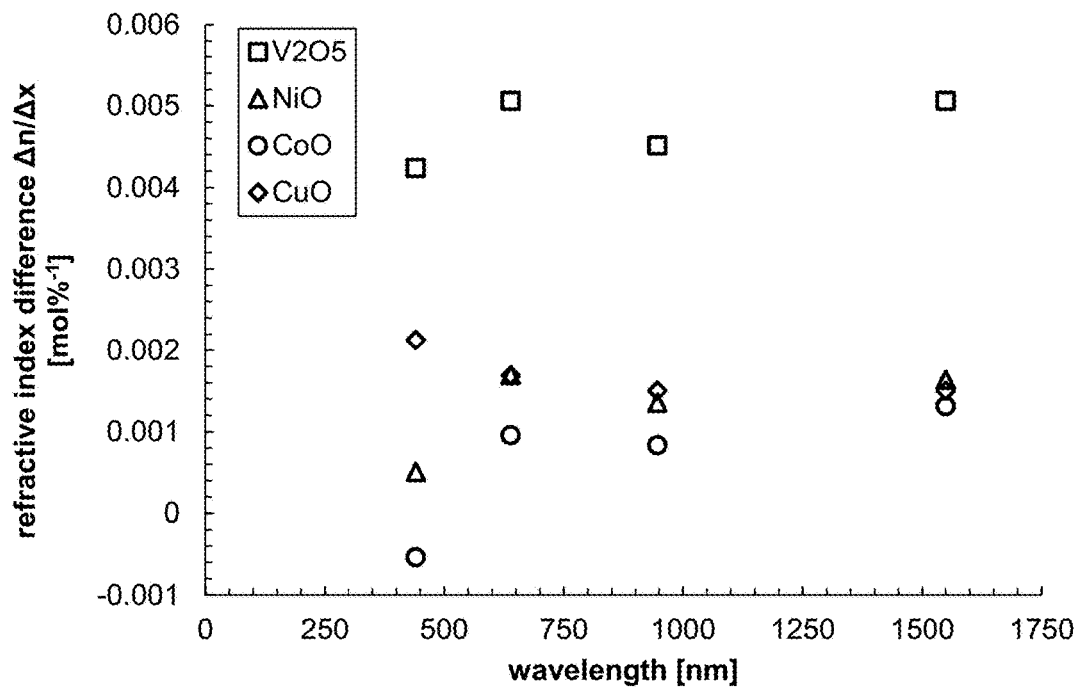
FIG. 5 shows the impact of different absorption components on the refractive index.

The impact of different absorption components on the refractive index is shown in FIG. 5. The introduction of absorption components induces a small change of the refractive index as indicated in FIG. 5. This change can be compensated by changing slightly the glass matrix composition.

Determination of the Refractive Index for a Given Wavelength λ

The glasses were doped and from time to time massively doped so that it was not any longer to look through. Because of the lack of transmittance it was not possible to perform anymore any transmissive measurement of the refractive index. In order to circumvent this difficulty we used some reflective approaches, however these measures could only be achieved on four different wavelengths, namely 441 nm, 639 nm, 947 nm and 1550 nm. These wavelength values are also presented in FIG. 5.

Using these experimental values we fitted a phenomenological Sellmeier law describing the dispersion of the glass as a function of the wavelength. Using this dispersion formula we describe the refractive index for a given wavelength $n_\lambda$, the partial derivative of the refractive index $$\frac{\partial n_\lambda}{\partial \lambda}$$

as well as the Abbe number. The Sellmeier formulation is shown below:

$$n_\lambda = \sqrt{1 + \frac{B_1 \cdot \lambda^2}{C_1 - \lambda^2} + \frac{B_2 \cdot \lambda^2}{C_2 - \lambda^2} + \frac{B_3 \cdot \lambda^2}{C_3 - \lambda^2}}$$

In this above formulation the wavelengths are expressed in [μm] not in [nm].

LIST OF REFERENCE SIGNS 1 crystallographic axis c
2 cladding glass 3 doped sapphire crystal
4 laser light of the preferred direction
5 parasitic laser light
6 proportions of the parasitic laser light which have entered the cladding glass

The invention claimed is:

1. A glass having a refractive index of at least 1.70, the glass comprising the following components (in % by weight):

| Component | Proportion (% by weight) |
|---|---|
| $SiO_2$ | 20 to 50 |
| $B_2O_3$ | 0 to 5 |
| BaO | 1 to 15 |
| CaO | 0 to 10 |
| SrO | 0 to 2 |
| ZnO | 0 to 5 |
| $Na_2O$ | 2 to 20 |
| $K_2O$ | 1 to 15 |
| $TiO_2$ | 10 to 50 |
| $La_2O_3$ | 0 to 5 |
| $ZrO_2$ | 0 to 5 |
| $Nb_2O_5$ | 1 to 20 |
| $Y_2O_3$ | 0 to 5 |
| absorption component | 0.1 to 10 |
| $As_2O_3$ | 0 to 1 |
| $Sb_2O_3$ | 0 to 1, | wherein the absorption component is selected from the group consisting of: CuO, NiO, CoO, $Fe_2O_3$, $V_2O_5$, CrO, MnO, $SeO_2$, and mixtures of two or more thereof, and wherein the glass has a linear thermal expansion of the glass $<\alpha_{glass}>$ in a range of $4.5*10^{-6}$ $K^{-1}$ to $7.0*10^{-6}$ $K^{-1}$ in a temperature range of $-30°$ C. to $70°$ C.

2. The glass according to claim 1, wherein the equation $$c \times \varepsilon_\lambda \times l > -\frac{1}{2}\ln\left(\frac{1-\mathcal{A}}{R_{Glass/Env}}\right)$$

is fulfilled, wherein c is the proportion of the absorption component in the glass in mol %, $\varepsilon_\lambda$ is the molar extinction coefficient of the absorption component for light of the wavelength $\lambda$ in $(mm*mol\ \%)^{-1}$, l is the glass thickness in mm, $R_{Glass/Env}$ is the Fresnel coefficient given by the relation $$R_{Glass/Env} = \frac{(n_\lambda^{Env} - n_\lambda^{Glass})^2}{(n_\lambda^{Env} + n_\lambda^{Glass})^2}$$

with $n_\lambda^{Glass}$ being the refractive index of the glass for light of the wavelength $\lambda$ and $n_\lambda^{Env}$ being the refractive index of an environment for light of the wavelength $\lambda$, and A is the fraction of light of the wavelength $\lambda$ absorbed by the glass, wherein A is at least 0.95.

3. A cladding glass of a solid state laser, comprising the glass of claim 1.

4. A laser component, comprising
a) a core comprising doped sapphire, and
b) a cladding glass according to claim 3 on the core,
wherein for radiation in the wavelength range of 750 nm to 850 nm the extraordinary refractive index of the doped sapphire and the refractive index of the cladding glass differ from each other by at most 0.05.

5. A method for producing a laser component according to claim 4, comprising the following steps:
a) providing the doped sapphire,
b) providing the cladding glass, and
c) arranging the cladding glass on the doped sapphire.

6. A glass comprising a refractive index of at least 1.74 and the following components (in % by weight);

| Component | Proportion (% by weight) |
|---|---|
| $SiO_2$ | >15 to 45 |
| $Al_2O_3$ | 0.1 to 10 |
| PbO | 45 to 75 |
| $B_2O_3$ | 0 to 5 |
| BaO | 0 to 5 |
| CaO | 0 to 5 |
| SrO | 0 to 2 |
| ZnO | 0 to 5 |
| $Na_2O$ | 0 to 10 |
| $K_2O$ | 0 to 5 |
| $TiO_2$ | 0 to 20 |
| $La_2O_3$ | 0 to 5 |
| $ZrO_2$ | 0 to 5 |
| $Nb_2O_5$ | 0 to 5 |
| $Y_2O_3$ | 0 to 5 |
| absorption component | 0.1 to 10 |
| $As_2O_3$ | 0 to 1 |
| $Sb_2O_3$ | 0 to 1, | wherein the absorption component is selected from the group consisting of: CuO, NiO, CoO, $Fe_2O_3$, $V_2O_5$, CrO, MnO, $SeO_2$, and mixtures of two or more thereof, and
wherein the equation $$c \times \varepsilon_\lambda \times l > -\frac{1}{2}\ln\left(\frac{1-\mathcal{A}}{R_{Glass/Env}}\right)$$

is fulfilled, wherein c is the proportion of the absorption component in the glass in mol %, $\varepsilon_\lambda$ is the molar extinction coefficient of the absorption component for light of the wavelength $\lambda$ in $(mm*mol\ \%)^{-1}$, l is the glass thickness in mm, $R_{Glass/Env}$ is the Fresnel coefficient given by the relation $$R_{Glass/Env} = \frac{(n_\lambda^{Env} - n_\lambda^{Glass})^2}{(n_\lambda^{Env} + n_\lambda^{Glass})^2}$$

with $n_\lambda^{Glass}$ being the refractive index of the glass for light of the wavelength $\lambda$ and $n_\lambda^{Env}$ being the refractive index of an environment for light of the wavelength $\lambda$, and A is the fraction of light of the wavelength $\lambda$ absorbed by the glass, wherein A is at least 0.95.

7. A cladding glass of a solid state laser, comprising a glass having a refractive index of at least 1.74 and the following components (in % by weight):

| Component | Proportion (% by weight) |
|---|---|
| $SiO_2$ | >15 to 45 |
| $Al_2O_3$ | 0.1 to 10 |
| PbO | 45 to 75 |
| $B_2O_3$ | 0 to 5 |
| BaO | 0 to 5 |
| CaO | 0 to 5 |
| SrO | 0 to 2 |
| ZnO | 0 to 5 |

-continued

| Component | Proportion (% by weight) |
|---|---|
| $Na_2O$ | 0 to 10 |
| $K_2O$ | 0 to 5 |
| $TiO_2$ | 0 to 20 |
| $La_2O_3$ | 0 to 5 |
| $ZrO_2$ | 0 to 5 |
| $Nb_2O_5$ | 0 to 5 |
| $Y_2O_3$ | 0 to 5 |
| absorption component | 0.1 to 10 |
| $As_2O_3$ | 0 to 1 |
| $Sb_2O_3$ | 0 to 1, | wherein the absorption component is selected from the group consisting of: $CuO$, $NiO$, $CoO$, $Fe_2O_3$, $V_2O_5$, $CrO$, $MnO$, $SeO_2$, and mixtures of two or more thereof.

8. The cladding glass of claim 7, wherein the cladding glass has a thickness of 1 to 5 mm.

9. The cladding glass of claim 7, wherein the glass has an optical depth T of at least 1 in the direction of the parasitic laser light.

10. A laser component, comprising
a) a core comprising doped sapphire, and
b) a cladding glass according to claim 7 on the core,
wherein for radiation in the wavelength range of 750 nm to 850 nm the extraordinary refractive index of the doped sapphire and the refractive index of the cladding glass differ from each other by at most 0.05.

11. The laser component according to claim 10, wherein the sapphire is doped with a dopant which is selected from the group consisting of ions of the elements titanium, chromium, iron and vanadium.

12. The laser component according to claim 10, wherein the differentiation of the refractive index $((\partial n(\lambda)/\partial \lambda)|_{\lambda_0})$ at the wavelength $\lambda_0 = 800$ [nm] is between $-3.00 \times 10^{-5}$ and $-6.00 \times 10^{-5}$ [nm$^{-1}$] for the cladding glass, wherein $n(\lambda)$ is a refractive index of a given wavelength $\lambda$.

13. The laser component according to claim 10, wherein in a temperature range of $-30°$ C. to $70°$ C. the mean coefficient of linear longitudinal thermal expansion $\alpha$ of the cladding glass differs from the mean value of the mean coefficient of linear longitudinal thermal expansion of the doped sapphire, parallel to the crystallographic axis c of the sapphire, and the mean coefficient of linear longitudinal thermal expansion of the doped sapphire, orthogonal to the crystallographic axis c of the sapphire, by at most $0.5*10^{-6}$ $K^{-1}$.

14. The laser component according to claim 10, wherein the cladding glass comprises a coating and wherein the cladding glass is roughened on at least one side area.

15. A method for producing a laser component according to claim 10, comprising the following steps
a) providing of the doped sapphire,
b) providing of the cladding glass, and
c) arranging of the cladding glass on the doped sapphire.

16. The method for producing a laser component according to claim 15, wherein the arranging of the cladding glass on the doped sapphire is performed by optical contact bonding.

17. A glass comprising a refractive index of at least 1.74 and the following components (in % by weight):

| Component | Proportion (% by weight) |
|---|---|
| $SiO_2$ | >15 to 45 |
| $Al_2O_3$ | 0.1 to 10 |
| $PbO$ | 45 to 75 |
| $B_2O_3$ | 0 to 5 |
| $BaO$ | 0 to 5 |
| $CaO$ | 0 to 5 |
| $SrO$ | 0 to 2 |
| $ZnO$ | 0 to 5 |
| $Na_2O$ | 0 to 10 |
| $K_2O$ | 0 to 5 |
| $TiO_2$ | 0 to 20 |
| $La_2O_3$ | 0 to 5 |
| $ZrO_2$ | 0 to 5 |
| $Nb_2O_5$ | 0 to 5 |
| $Y_2O_3$ | 0 to 5 |
| absorption component | 0.1 to 10 |
| $As_2O_3$ | 0 to 1 |
| $Sb_2O_3$ | 0 to 1, | wherein the absorption component is selected from the group consisting of: $CuO$, $NiO$, $CoO$, $Fe_2O_3$, $V_2O_5$, $CrO$, $MnO$, $SeO_2$, and mixtures of two or more thereof, and wherein the glass has the linear thermal expansion of the glass $<\alpha_{glass}>$ in a range of $4.5*10^{-6}$ $K^{-1}$ to $7.0*10^{-6}$ $K^{-1}$ in a temperature range of $-30°$ C. to $70°$ C.

* * * * *